(12) United States Patent
Shibuya

(10) Patent No.: US 7,422,837 B2
(45) Date of Patent: Sep. 9, 2008

(54) PHOTOSENSITIVE COMPOSITION

(75) Inventor: Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 63 days.

(21) Appl. No.: 11/058,326

(22) Filed: Feb. 16, 2005

(65) Prior Publication Data

US 2005/0181305 A1  Aug. 18, 2005

(30) Foreign Application Priority Data

Feb. 16, 2004 (JP) .......................... P.2004-037774
Mar. 25, 2004 (JP) .......................... P.2004-089037

(51) Int. Cl.
*G03F 7/00* (2006.01)
*G03F 7/04* (2006.01)

(52) U.S. Cl. .............. 430/270.1; 430/270.15; 430/302; 546/1; 546/329

(58) Field of Classification Search .......... 430/270.1, 430/270.15, 302; 546/1, 329
See application file for complete search history.

(56) References Cited

U.S. PATENT DOCUMENTS

| | | | |
|---|---|---|---|
| 4,552,966 A * | 11/1985 | Ranken et al. ............. 546/290 |
| 4,600,678 A * | 7/1986 | Adair et al. ............... 430/138 |
| 5,085,886 A * | 2/1992 | Zupancic et al. .......... 427/510 |
| 5,120,569 A * | 6/1992 | Zupancic et al. .......... 427/510 |
| 5,143,817 A * | 9/1992 | Lawton et al. ............ 246/401 |
| 5,185,209 A * | 2/1993 | Zupancic .................. 428/457 |
| 5,185,210 A * | 2/1993 | Zupancic .................. 428/457 |
| 5,330,882 A * | 7/1994 | Kawaguchi et al. ........ 430/327 |
| 5,548,077 A * | 8/1996 | Kusumoto et al. ........ 536/55.3 |

FOREIGN PATENT DOCUMENTS

EP   1 262 829 A1   4/2002
JP   2000-258910 A  9/2000

* cited by examiner

*Primary Examiner*—Amanda C. Walke
(74) *Attorney, Agent, or Firm*—Sughrue Mion, PLLC

(57) ABSTRACT

A photosensitive composition comprising (i) at least one titanocene compound, (ii) a pyridine compound having a structure represented by formula (1) defined in the specification or a cyan compound having a structure represented by formula (3) defined in the specification, and (iii) a compound capable of undergoing a reaction with at least one of a radical and an acid to irreversibly change its physical or chemical property.

6 Claims, No Drawings

PHOTOSENSITIVE COMPOSITION

FIELD OF THE INVENTION

The present invention relates to a photosensitive composition containing a novel photo-initiation system particularly a photo-initiation system, which is highly sensitive and excellent in stability, Also, the invention relates to a photopolymerizable composition, which is particularly excellent as a material for a lithographic printing plate precursor enabling plate-making by scanning exposure based on digital signals.

BACKGROUND OF THE INVENTION

Hitherto, a PS plate having a construction such that a lipophilic photosensitive resin layer is provided on a hydrophilic support has been broadly used as a lithographic printing plate precursor. As for the plate-making method thereof, the PS plate is ordinarily subjected to mask exposure (open-frame-exposure) through a lith film and then dissolving and removing the non-image area to obtain a desired printing plate.

In recent years, digitization techniques of electronically processing, accumulating and outputting image information using a computer have been widespread and various new image output systems corresponding thereto have been put into practical use. As a result, a computer-to-plate (CTP) technique of directly producing a printing plate without using a lith film but by scanning highly directional light such as laser light based on the digitized image information is demanded and it is now an important technical subject to obtain a printing plate precursor suitable for such a technique.

As one system for obtaining such a lithographic printing plate precursor capable of subjecting scanning exposure, a construction such that a photopolymerizable composition having excellent photosensitive speed is used as an ink-receptive photosensitive resin layer (hereinafter referred to as a "photosensitive layer") provided on a hydrophilic support has been heretofore proposed and lithographic printing plate precursors having such a construction are already available on the market. The printing plate precursor having such a construction is subjected to development processing in a simple and easy way and exhibits desired plate-making and printing performances of providing excellent resolution, adhesion of ink, press life and scum resistance.

The photopolymerizable composition fundamentally comprises an ethylenically unsaturated compound, a photopolymerization initiation system and a binder resin, and the photo-initiation system absorbs light to produce an active radical and the radical induces the addition polymerization of the ethylenically unsaturated compound, as a result, the photosensitive layer is insolubilized, thereby effecting image formation.

Most of conventional proposals regarding the photopolymerizable composition capable of being subjected to scanning exposure utilize a photo-initiation system excellent in photosensitivity, and many compositions therefor are described, for example, in Non-patent Documents 1 and 2 shown below.

In conventional CTP systems using a photopolymerizable composition comprising the above-described initiation system and a long wavelength visible light source such as an Ar laser (488 nm) or FD-YAG laser (532 nm) as a light source, it is required to write at a higher speed in order to increase productivity in the plate-making step. However, such a requirement has not been achieved because the output of light source is not sufficiently high and the sensitivity of photosensitive material is not sufficiently high.

On the other hand, a semiconductor laser capable of performing continuous oscillation in the region of from 350 to 450 nm using, for example, an InGaN series material has been recently put into practical use. A scanning exposure system using such a short wavelength light source is advantageous in that an economical system can be constructed while maintaining sufficiently high output since the semiconductor laser can be produced at a low cost in view of its structure. Also, as compared with conventional systems using an FD-YAG or Ar laser, a photosensitive material having a photosensitive range in a short wavelength region and enabling working under brighter safe light can be used.

However, a photo-initiation system having a high sensitivity sufficiently for scanning exposure in the short wavelength region of from 350 to 450 nm has not yet been known.

In the imaging field widely, the technique for obtaining a photo-initiation system having a high sensitivity is still keenly demanded (see, for example, Patent Document 1 and Non-patent Documents 3 and 4 shown below). Such a photo-initiation system is also expected to application to image formation, for example, optical modeling, holography and color hard copy, to a field of production of an electronic material, for example, photoresist, or to use as a photocurable resin material, for example, ink, paint or adhesive. It has been desired in the fields of these industries to find a sensitizing dye excellent in light-absorbing property and sensitizing property in order to effectively induce decomposition of an active agent.

Non-patent Document 1: Bruce M. Monroe et al., *Chemical Review*, Vo. 93, pages 435 to 448 (1993)

Non-patent Document 2: R. S. Davidson, *Journal of Photochemistry and Biology A: Chemistry*, Vol. 73, pages 81 to 96 (1993)

Non-patent Document 3: J. P. Faussier, *Photoinitiated Polymerization-Theory and Applications: Rapra Review*, Vol. 9, Report, Rapra Technology (1998)

Non-patent Document 4: M. Tsunooka et al, *Prog. Polym. Sci.*, Vol. 21, page 1 (1996).

Patent Document 1: JP-A-2000-258910 (the term "JP-A" as used herein means an "unexamined published Japanese patent application")

SUMMARY OF THE INVENTION

An object of the present invention is to provide a photosensitive composition, which can produce, for example, a lithographic printing plate precursor for scanning exposure suitable for the CTP system excellent in workability and profitability and particularly, to provide a photosensitive composition, which is highly sensitive to light having a wavelength of a wide region of from 350 to 450 nm and is suitable, for example, for a lithographic printing plate precursor highly sensitive to an oscillation wavelength of a short wavelength semiconductor laser.

As a result of extensive investigations to achieve the above-described objects, the inventor has found that a novel photo-initiation system comprising a pyridine compound or cyan compound having a specific structure and a titanocene compound provide an especially high photosensitivity to complete the invention.

Specifically, the invention includes the following items.

(1) A photosensitive composition comprising (i) a titanocene compound, (ii) a compound selected from a pyridine compound represented by formula (1) shown below and a cyan compound represented by formula (3) shown below, and (iii) a compound capable of undergoing a reaction with at least one of a radical and an acid to irreversibly change its physical or chemical property.

(2) A photosensitive composition comprising (i) a titanocene compound, (ii) a pyridine compound represented by formula (1) shown below, and (iii) a compound capable of undergoing a reaction with at least one of a radical and an acid to irreversibly change its physical or chemical property:

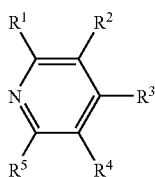

wherein $R^1$, $R^2$, $R^3$, $R^4$ and $R^5$ each independently represents a hydrogen atom, a halogen atom or an organic group, or at least one of $R^1$ and $R^2$, $R^2$ and $R^3$, $R^3$ and $R^4$, and $R^4$ and $R^5$ may be combined with each other to form a ring, provided that at least one of $R^1$, $R^2$, $R^3$, $R^4$ and $R^5$ represents an organic group represented by formula (2) shown below;

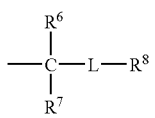

wherein $R^6$, $R^7$ and $R^8$ each independently represents a hydrogen atom, a halogen atom or an organic group, or $R^7$ and $R^8$, $R^6$ and $R^7$, or $R^6$ and $R^8$ may be combined with each other to form a ring; and L represents a divalent connecting group containing a hetero atom.

(3) A photosensitive composition comprising (i) a titanocene compound, (ii) a cyan compound represented by formula (3) shown below, and (iii) a compound capable of undergoing a reaction with at least one of a radical and an acid to irreversibly change its physical or chemical property:

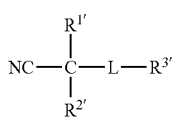

wherein $R^{1'}$, $R^{2'}$ and $R^{3'}$ each independently represents a hydrogen atom a halogen atom or an organic group, or $R^{1'}$ and $R^{2'}$, $R^{2'}$ and $R^{3'}$, or $R^{1'}$ and $R^{3'}$ may be combined with each other to form a ring; and L represents a divalent connecting group containing a hetero atom.

(4) The photosensitive composition as described in (1), (2) or (3) above, wherein the compound capable of undergoing a reaction with at least one of a radical and an acid to irreversibly change its physical or chemical property is a compound having an ethylenically unsaturated double bond.

DETAILED DESCRIPTION OF THE INVENTION

The photosensitive composition containing a compound represented by formula (1) or (3) and a titanocene compound has a sensitivity sufficient for scanning exposure using a laser light source having a wavelength of 450 nm or shorter, and is useful, for example, for a lithographic printing plate precursor for scanning exposure suitable for the CTP system, which is capable of being handled under a bright safe light and is excellent in workability, profitability and press life.

The invention will be described in detail below.

<A. Photo-Initiation System>

The photo-initiation system of the invention comprises (i) a pyridine compound having a specific structure represented by formula (1) or cyan compound having a specific structure represented by formula (3), and (ii) a titanocene compound.

One of the features of the photo-initiation system of the invention resides in its excellent photosensitive characteristics in the region of from 350 to 450 nm. It is described, for example, in JP-B4-47680 (the term "JP-B" as used herein means an "examined Japanese patent publication") that a photo-initiation system containing a titanocene compound, which is used in the invention, is useful for a photopolymerizable composition for scanning exposure. Since the titanocene compound has an absorption wavelength in the region of from 350 to 450 nm, it is efficiently decomposed upon exposure to light of the short wavelength region of from 350 to 450 nm, but due to its low molar extinction coefficient, it does not exhibit sufficient sensitivity by itself. On the contrary, the inventors have found that the photosensitivity of the titanocene compound can be increased by coexistence of the titanocene compound with the compound having the specific structure according to the invention. Although the reason for this is not completely clear, it is believed that generation of a new radical due to interaction of the compound according to the invention with the titanocene compound upon exposure to light and decomposition of the compound contributes to enhancing the sensitivity. Further, the photo-initiation system of the invention can coexist with a sensitizing dye having an absorption wavelength in a region of from 350 to 450 nm, if desired. In order to achieve sufficient sensitivity for scanning exposure, it is preferred that the photo-initiation system coexists with the sensitizing dye.

(A1) Pyridine Compound

The pyridine compound for use in the invention is a compound represented by the following formula (1);

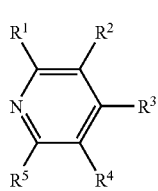

wherein $R^1$, $R^2$, $R^3$, $R^4$ and $R^5$ each independently represents a hydrogen atom, a halogen atom or an organic group, or at least one of $R^1$ and $R^2$, $R^2$ and $R^3$, $R^3$ and $R^4$, and $R^4$ and $R^5$ may be combined with each other to form a ring, provided that at least one of $R^1$, $R^2$, $R^3$, $R^4$ and $R^5$ represents a group represented by formula (2) shown below;

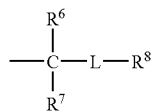
(2)

wherein $R^6$, $R^7$ and $R^8$ each independently represents a hydrogen atom, a halogen atom or an organic group, or $R^7$ and $R^8$, $R^6$ and $R^7$, or $R^6$ and $R^8$ may be combined with each other to form a ring; and L represents a divalent connecting group containing a hetero atom.

The organic group represented by any one of $R^1$, $R^2$, $R^3$, $R^4$ and $R^5$ includes, for example, an alkyl group, a substituted alkyl group, an aryl group, a substituted aryl group, an alkenyl group, a substituted alkenyl group, an alkynyl group, a substituted alkynyl group, a hydroxy group, a substituted oxy group, a mercapto group a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group, a silyl group and the group represented by formula (2).

The organic group represented by any one of $R^6$, $R^7$ and $R^8$ includes, for example, the organic groups described for $R^1$, $R^2$, $R^3$, $R^4$ and $R^5$ above excluding the group represented by formula (2).

Preferably, in formula (1), $R^1$, $R^2$, $R^3$, $R^4$ and $R^5$ each independently represents a hydrogen atom, a halogen atom, an alkyl group, a substituted alkyl group, an aryl group, a substituted aryl group, an alkenyl group, a substituted alkenyl group, an alkynyl group, a substituted alkynyl group, a hydroxy group, a substituted oxy group, a mercapto group a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group, or at least one of $R^1$ and $R^2$, $R^2$ and $R^3$, $R^3$ and $R^4$, and $R^4$ and $R^5$ may be combined with each other to form a ring, provided that at least one of $R^1$, $R^2$, $R^3$, $R^4$ and $R^5$ represents the group represented by formula (2).

Preferably, in formula (2), $R^6$ and $R^7$ each independently represents a hydrogen atom, a halogen atom, an alkyl group, a substituted alkyl group, an aryl group, a substituted aryl group, an alkenyl group, a substituted alkenyl group, an alkynyl group or a substituted alkynyl group, $R^8$ represents a hydrogen atom, an alkyl group, a substituted alkyl group, an aryl group, a substituted aryl group, an alkenyl group, a substituted alkenyl group, an alkynyl group, a substituted alkynyl group, a hydroxy group, a substituted oxy group, a mercapto group, a substituted thio group, an amino group or a substituted amino group, or $R^7$ and $R^8$, $R^6$ and $R^7$, or $R^6$ and $R^8$ may be combined with each other to form a ring.

The organic groups represented by $R^1$, $R^2$, $R^3$, $R^4$ and $R^5$ are described in detail below.

The alkyl group preferably includes a straight chain, branched or cyclic alkyl group having from 1 to 20 carbon atoms. Specific examples thereof include methyl, ethyl, propyl, butyl, pentyl hexyl, heptyl, octyl, nonyl, decyl, undecyl, dodecyl, tridecyl, hexadecyl, octadecyl, eicosyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl and 2-norbornyl groups. Of the alkyl groups, a straight chain alkyl group having from 1 to 12 carbon atoms, a branched alkyl group having from 3 to 12 carbon atoms and a cyclic alkyl group having from 5 to 10 carbon atoms are more preferred.

The substituted alkyl group is preferably composed of a substituent bonding to an alkylene group. The substituent includes a monovalent non-metallic atomic group exclusive of a hydrogen atom. Preferred examples of the substituent for the alkyl group include a halogen atom (e.g., fluorine, bromine, chlorine or iodine), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, N'-arylureido group, an N',N'-diarylureido group, an N'-alkyl-N'-arylureido group, an N-alkylureido group, N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group and a conjugate base group thereof (hereinafter, referred to as a carboxylato group), an alkoxycarbonyl group, an aryloxycarbonyl group, a carbamoyl group, an N-alkylcarbamoyl group, an N,N-dialkylcarbanoyl group, an N-arylcarbamoyl group, an N,N-dialkylcarbanoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter, referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group (—$SO_2NHSO_2$(alkyl)) and a conjugate base group thereof, an N-arylsulfonylsulfamoyl group (—$SO_2NHSO_2$(aryl)) and a conjugate base group thereof, an N-alkylsulfonylcarbamoyl group (—$CONHSO_2$(alkyl)) and a conjugate base group thereof, an N-arylsulfonylcarbamoyl group (—$CONHSO_2$(aryl)) and a conjugate base group thereof, an alkoxysilyl group (—$Si(O-alkyl)_3$), an aryloxysilyl group (—$Si(O-aryl)_3$), a hydroxysilyl group (—$Si(OH)_3$) and a conjugate base group thereof, a phosphono group (—$PO_3H_2$) and a conjugate base group thereof (hereinafter, referred to as a phosphonato group), a dialkylphosphono group (—$PO_3(alkyl)_2$), a diarylphosphono group (—$PO_3$ (aryl)$_2$), an alkylarylphosphono group (—PO$_3$(alkyl)(aryl)), a monoalkylphosphono group (—PO$_3$H(alkyl)) and a conjugate base group thereof (hereinafter, referred to as an alkylphosphonato group), a monoarylphosphono group (—PO$_3$H(aryl)) and a conjugate base group thereof (hereinafter, referred to as an arylphosphonato group), a phosphonoxy group (—OPO$_3$H$_2$) and a conjugate base group thereof (hereinafter, referred to as a phosphonatoxy group), a dialkylphosphonoxy group (—OPO$_3$(alkyl)$_2$), a diarylphosphonoxy group (—OPO$_3$(aryl)$_2$), an alkylarylphosphonoxy group (—OPO$_3$(alkyl)(aryl)), a monoalkylphosphonoxy group (—OPO$_3$H(alkyl)) and a conjugate base group thereof (hereinafter, referred to as an alkylphosphonatoxy group), a monoarylphosphonoxy group (—OPO$_3$H(aryl)) and a conjugate base group thereof (hereinafter, referred to as an arylphosphonatoxy group), a cyano group, a nitro group, an aryl group, an alkenyl group and an alkynyl group.

Specific examples of the alkyl group in the substituents include those described above. Specific examples of the aryl group in the substituents include phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, nitrophenyl, cyanophenyl, sulfophenyl, sufonatophenyl, phosphonophenyl and phosphonatophenyl groups. Specific examples of the alkenyl group include vinyl, 1-propenyl, 1-butenyl, cinnamyl and 2-chloro-1-ethenyl groups. Specific examples of the alkynyl group include ethynyl, 1-propynyl, 1-butynyl, trimethylsilylethynyl and phenylethynyl groups.

In the acyl group (R$^{13}$CO—) described above, R$^{13}$ represents a hydrogen atom or the above-described alkyl group, aryl group, alkenyl group or alkynyl group.

In the substituted alkyl group, an alkylene group includes a divalent organic residue obtained by eliminating any one of hydrogen atoms on the alkyl group having from 1 to 20 carbon atoms described above, and preferably a straight chain alkylene group having from 1 to 12 carbon atoms, a branched alkylene group having from 3 to 12 carbon atoms and a cyclic alkylene group having from 5 to 10 carbon atoms.

Specific preferred examples of the substituted alkyl group include chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylbutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl), N,N-dipropylsulfamoylpropyl, N-tolylsulfamoylpropyl, N-methyl-N-(phosphonophenyl)sulfamoyloctyl,

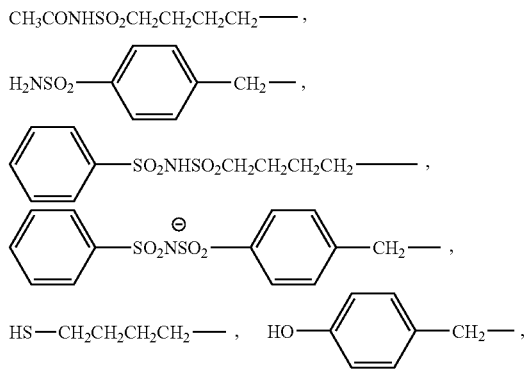

phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonoxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups.

The aryl group includes a condensed ring of one to three benzene rings and a condensed ring of a benzene ring and a 5-membered unsaturated ring. Specific examples of the aryl group include phenyl, naphthyl, anthryl, phenanthryl, indenyl, acenaphthenyl and fluorenyl groups. Of these groups, a phenyl group and a naphthyl group are preferred.

The substituted aryl group is a group formed by bonding a substituent to an aryl group and includes groups having a monovalent non-metallic atomic group exclusive of a hydrogen atom as a substituent, on the ring-forming carbon atom of the above-described aryl group. Examples of the substituent include the above-described alkyl and substituted alkyl group and the substituents for the substituted alkyl group.

Specific preferred examples of the substituted aryl group include biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allylphenyl, 1-propenylmethylphenyl, 2-butenylphenyl, 2-methylallylphenyl, 2-methylpropenylphenyl, 2-propynylphenyl, 2-butynylphenyl and 3-butynylphenyl groups.

The alkenyl group includes that described above. The substituted alkenyl group is a group formed by replacing a hydrogen atom of the alkenyl group with a substituent. Examples of the substituent include the substituents for the substituted alkyl group described above, and the alkenyl group is that described above. Preferred examples of the substituted alkenyl group include the following groups:

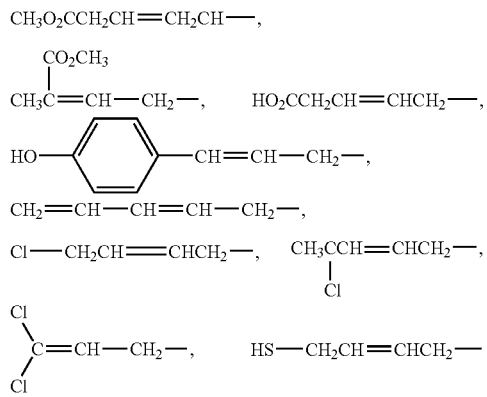

The alkynyl group includes that described above. The substituted alkynyl group is a group formed by replacing a hydrogen atom of the alkynyl group with a substituent. Examples of the substituent include the substituents for the substituted alkyl group described above, and the alkynyl group is that described above.

The halogen atom preferably includes fluorine, chlorine, bromine and iodine atoms.

In the substituted oxy group ($R^{14}O$—) described above, $R^{14}$ represents a monovalent non-metallic atomic group excusive of a hydrogen atom. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonatoxy group. The alkyl group and aryl group in the above-described substituted oxy group include those described for the alkyl group, substituted alkyl group, aryl group and substituted aryl group above. In an acyl group ($R^{15}CO$—) in the acyloxy group described above, $R^{15}$ represents the alkyl group, substituted alkyl group, aryl group and substituted aryl group described above. Of the substituted oxy groups, an alkoxy group, an aryloxy group, an acyloxy group and an arylsulfoxy group are more preferred, Specific preferred examples of the substituted oxy group include methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy and phosphonatoxy groups.

In the substituted thio group ($R^{16}S$—) described above, $R^{16}$ represents a monovalent non-metallic atomic group excusive of a hydrogen atom. Preferred examples of the substituted thio group include an alkylthio group, an arylthio group, an alkyldithio group, an aryldithio group and an acylthio group. The alkyl group and aryl group in the above-described substituted thio group include those described for the alkyl group, substituted alkyl group, aryl group and substituted aryl group above. In an acyl group ($R^{15}CO$—) in the acylthio group described above, $R^{15}$ has the same meaning as described above. Of the substituted thio groups, an alkylthio group and an arylthio group are more preferred. Specific preferred examples of the substituted thio group include methylthio, ethylthio, phenylthio, ethoxyethylthio, carboxyethylthio and methoxycarbonylthio groups.

In the substituted amino group ($R^{17}NH$— or ($R^{18}$)($R^{19}$)N—) described above, $R^{17}$, $R^{18}$ and $R^{19}$ each represents a monovalent non-metallic atomic group excusive of a hydrogen atom. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and aryl group in the above-described substituted amino group include those described for the alkyl group, substituted alkyl group, aryl group and substituted aryl group above. In an acyl group ($R^{15}CO$—) in the acylamino group, N-alkylacylamino group or N-arylacylamino group described above, $R^{15}$ has the same meaning as described above.

Of the substituted amino groups, an N-alkylamino group, an N,N-dialkylamino group, an. N-arylamino group and an acylamino group are more preferred. Specific preferred examples of the substituted amino group include methylamino, ethylamino, diethylamino, morpholino, piperidino, pyrrolidino, phenylamino, benzoylamino and acetylamino groups In the substituted carbonyl group ($R^{20}$—CO—) described above, $R^{20}$ represents a monovalent non-metallic atomic group excusive of a hydrogen atom. Preferred examples of the substituted carbonyl group include a formyl group, an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group and aryl group in the above-described substituted carbonyl group include those described for the alkyl group, substituted alkyl group, aryl group and substituted aryl group above.

Of the substituted carbonyl groups, a formyl group, an acyl group, a carboxy group, an alkoxycarbonyl group, an aryloxycarbonyl group, a carbamoyl group, an N-alkylcarbamoyl group, an N,N-dialkylcarbamoyl group and an N-arylcarbamoyl group are more preferred, and a formyl group, an acyl group, an alkoxycarbonyl group and an aryloxycarbonyl group are still more preferred. Specific preferred examples of the substituted carbonyl group include formyl, acetyl, benzoyl, carboxy, methoxycarbonyl, allyloxycarbonyl, N-methylcarbamoyl, N-phenylcarbamoyl, N,N-diethylcarbamoyl and morpholinocarbonyl groups.

In the substituted sulfinyl group ($R^{21}$—SO—) described above, $R^{21}$ represents a monovalent non-metallic atomic group excusive of a hydrogen atom. Preferred examples of the substituted sulfinyl group include an alkylsulfinyl group, an arylsulfinyl group, a sulfinamoyl group, an N-alkyl sulfinamoyl group, an N,N-dialkylsulfinamoyl group, an N-arylsulfinamoyl group, an N,N-diarylsulfinamoyl group and an N-alkyl-N-arylsulfinamoyl group The alkyl group and aryl group in the above-described substituted sulfinyl group include those described for the alkyl group, substituted alkyl group, aryl group and substituted aryl group above. Of the substituted sulfinyl groups, an alkylsulfinyl group and an arylsulfinyl group are more preferred. Specific examples of the substituted sulfinyl group include hexylsulfinyl, benzylsulfinyl and tolylsulfinyl groups.

In the substituted sulfonyl group ($R^{22}$—SO$_2$—) described above, $R^{22}$ represents a monovalent non-metallic atomic group excusive of a hydrogen atom. Preferred examples of the substituted sulfonyl group include an alkylsulfonyl group and an arylsulfonyl group. The alkyl group and aryl group in the above-described substituted sulfonyl group include those described for the alkyl group, substituted alkyl group, aryl group and substituted aryl group above. Specific examples of the substituted sulfonyl group include butylsulfonyl and chlorophenylsulfonyl groups.

The sulfonato group (—SO$_3^-$) described above means a conjugate base anion group of a sulfo group (—SO$_3$H) as described above. Ordinarily, it is preferred to use together with a counter cation. Examples of the counter cation include those conventionally known, for example, various oniums (e.g., ammonium, sulfonium, phosphonium iodonium or azinium) and metal ions (e.g., Na$^+$, K$^+$, Ca$^{2+}$ or Zn$^{2+}$).

The substituted phosphono group described above means a group formed by substituting one or two hydroxy groups of a phosphono group with one or two other organic oxy groups. Preferred examples of the substituted phosphono group include a dialkylphosphono group, a diarylphosphono group, an alkylarylphosphono group, a monoalkylphosphono group and a monoarylphosphono group as described above. Of the substituted phosphono groups, a dialkylphosphono group and a diarylphosphono group are more preferred. Specific examples of the substituted phosphono group include diethylphosphono, dibutylphosphono and diphenylphosphono groups.

The phosphonato group (—PO$_3^{2-}$ or —PO$_3$H$^-$) described above means a conjugate base anion group of a phosphono group (—PO$_3$H$_2$) resulting from primary acid dissociation or secondary acid dissociation as described above Ordinarily, it is preferred to use together with a counter cation. Examples of the counter cation include those conventionally known, for example, various oniums (e.g., ammonium sulfonium, phosphonium iodonium or azinium) and metal ions (e.g., Na$^+$, K$^+$, Ca$^{2+}$ or Zn$^{2+}$).

The substituted phosphonato group described above means a conjugate base anion group of a group formed by substituting one hydroxy group of a phosphono group with another organic oxy group. Specific examples of the substituted phosphonato group include a conjugate base group of a monoalkylphosphono group (—PO$_3$H(alkyl)) and a conjugate base group of a monoarylphosphono group (—PO$_3$H(aryl)). Ordinarily, it is preferred to use together with a counter cation. Examples of the counter cation include those conventionally known, for example, various oniums (e.g., ammonium, sulfonium, phosphonium iodonium or azinium) and metal ions (e.g., Na$^+$, K$^+$, Ca$^{2+}$ or Zn$^{2+}$).

The silyl group described above includes a group represented by $(R^{23})(R^{24})(R^{25})$Si— wherein $R^{23}$, $R^{24}$ and $R^{25}$ each independently represents a monovalent non-metallic atomic group. Preferred examples of the monovalent non-metallic atomic group include the alkyl group, substituted alkyl group, aryl group and substituted aryl group described above. Preferred examples of the silyl group include trimethylsilyl, tributylsilyl, tert-butyldimethylsilyl and dimethylphenylsilyl group.

Of the groups for $R^1$, $R^2$, $R^3$, $R^4$ and $R^5$ illustrated above, a hydrogen atom, a halogen atom (e.g., fluorine, bromine, chlorine or iodine), an alkyl group, a substituted alkyl group, an aryl group, a substituted aryl group, a substituted oxy group, a substituted thio group, a substituted amino group, a substituted carbonyl group, a sulfo group, a sulfonato group and a cyano group are more preferred, and a hydrogen atom, a halogen atom, an alkyl group, a substituted alkyl group, an aryl group and a substituted carbonyl group are still more preferred.

Now, the cyclic structure formed by combining at least one of $R^1$ and $R^2$, $R^2$ and $R^3$, $R^3$ and $R^4$, and $R^4$ and $R^5$ with each other is described below. Examples of the cyclic structure include a saturated or unsaturated aliphatic ring formed by combining $R^1$ and $R^2$, $R^2$ and $R^3$, $R^3$ and $R^4$, or $R^4$ and $R^5$ with each other, preferably a 5-membered, 6-membered, 7-membered or 8-membered aliphatic ring formed together with carbon atoms to which $R^1$, $R^2$, $R^3$, $R^4$ and $R^5$ are connected, and more preferably a 5-membered or 6-membered aliphatic ring. The aliphatic ring may have one or more substituents (examples thereof include the substituents for the substituted alkyl group described above) on one or more carbon atoms constituting the ring. Also, a part of the ring-constituting carbon atoms may be replaced by hetero atom(s) (for example, an oxygen atom, a sulfur atom or a nitrogen atom). Further, the aliphatic ring may be condensed with an aromatic ring. Preferred examples thereof include a cyclopentane ring, a cyclohexane ring, a cycloheptane ring, a cyclooctane ring, a cyclo-1,3-dioxapentane ring, a cyclopentene ring, a cyclohexene ring, a cycloheptene ring, a cyclooctene ring, a cyclo-1,3-dioxapentene ring, a cyclo-1,3-dioxahexene ring, a cyclohexadiene ring, a benzocyclohexene ring, a benzocyclohexadiene ring and a tetrahydropyranone ring.

Examples of the cyclic structure also include an aromatic ring formed by combining $R^1$ and $R^2$, $R^2$ and $R^3$, $R^3$ and $R^4$, or $R^4$ and $R^5$ with each other. Examples of the aromatic ring preferably include a quinoline ring, an isoquinoline ring, an acridine ring, a phenanthridine ring, a benzoquinoline ring and a benzisoquinoline ring, and more preferably a quinoline ring. The aromatic ring may have one or more substituents (examples thereof include the substituents for the substituted alkyl group described above) on one or more carbon atoms constituting the ring.

Now, preferred examples of the group for $R^6$ or $R^7$ in formula (2) are described below. The halogen atom preferably includes fluorine, chlorine, bromine and iodine atoms. Preferred examples of the alkyl group, substituted alkyl group, aryl group, substituted aryl group, alkenyl group, substituted alkenyl group, alkynyl group and substituted alkynyl group include those described for $R^1$ to $R^5$ in formula (1), respectively. More preferred examples for each of $R^6$ and $R^7$ include a hydrogen atom and an alkyl group.

Now, preferred examples of the group for $R^8$ in formula (2) are described below. Preferred examples of the alkyl group, substituted alkyl group, aryl group, substituted aryl group, alkenyl group, substituted alkenyl group, alkynyl group, substituted alkynyl group, hydroxy group, substituted oxy group, mercapto group, substituted thio group, amino group and substituted amino group include those described for $R^1$ to $R^5$ in formula (1), respectively. More preferred examples for $R^8$ include an alkyl group, a substituted alkyl group, an aryl group, a substituted aryl group and an alkenyl group.

Also, at least one of $R^7$ and $R^8$, $R^6$ and $R^7$, and $R^6$ and $R^8$ may be combined with each other to form a saturated or unsaturated aliphatic ring. Examples of the saturated or unsaturated aliphatic ring include preferably a 5-membered, 6-membered, 7-membered or 8-membered aliphatic ring formed together with carbon atoms to which $R^6$, $R^7$ and $R^8$ are connected, and more preferably a 5-membered or 6-membered aliphatic ring. The aliphatic ring may have one or more substituents (examples thereof include the substituents for the substituted alkyl group described above) on one or more carbon atoms constituting the ring. Also, a part of the ring-constituting carbon atoms may be replaced by hetero atom(s) (for example, an oxygen atom, a sulfur atom or a nitrogen atom). Further, the aliphatic ring may be condensed with an aromatic ring. Preferred examples thereof include a cyclopentane ring, a cyclohexane ring, a cycloheptane ring, a cyclooctane ring, a cyclo-1,3-dioxapentane ring, a cyclopentene ring, a cyclohexene ring, a cycloheptene ring, a cyclooctene ring, a cyclo-1,3-dioxapentene ring, a cyclo-1,3-dioxahexene ring, a cyclohexadiene ring, a benzocyclohexene ring, a benzocyclohexadiene ring and a perhydropyranone ring.

Now, L in formula (2) is described below. L represents a divalent connecting group containing a hetero atom.

Specifically, L includes a partial structure (L') shown below.

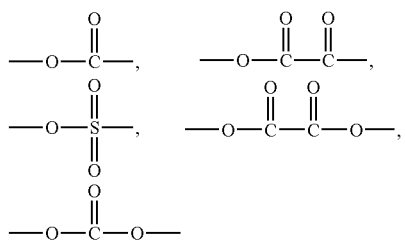

The terminology "L includes a partial structure shown below" means that L as a connecting group or a terminal group, includes at least one of the partial structures shown above. L may include two or more partial structures shown above. Specifically, L may be one of the partial structures shown above itself, a group formed by connecting two or more partial structures shown above each other, or a group formed by connecting the partial structure shown above with other group, for example, a hydrocarbon group. Particularly preferred specific examples of L include the following structures:

Preferred specific examples of the compound represented by formula (1) are set forth below, but the invention should not be construed as being limited thereto.

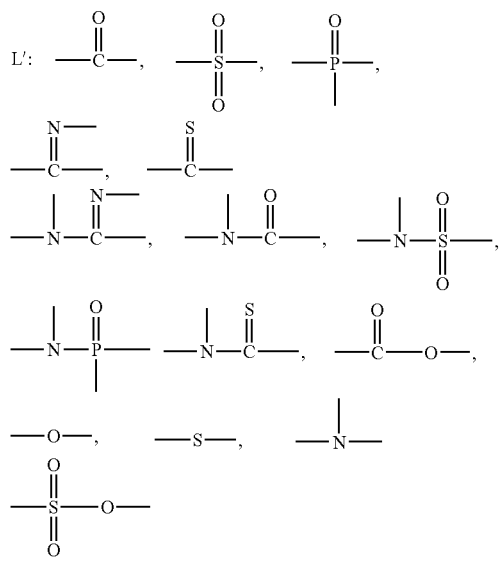

-continued (A type)

[Structure: NC-CH2-N(R)-C(=O)-N(R)-R3]

| | R⁶ | R⁷ | R⁹ | R¹⁰ | R¹³ |
|---|---|---|---|---|---|
| P-13 | H | H | H | H | 4-tBu-C₆H₄- |
| P-14 | H | H | H | H | CH₃-NH-CH₃ (N-methyl) |
| P-15 | H | H | H | H | CH₃CH₂O— |
| P-16 | H | H | H | H | -C(Ph)(Ph)-OH |

(B type)

[Pyridine with R⁶, R⁷, R⁸, R¹⁰ substituents and CH₂-O-C(=O)-R¹³ group]

| | R⁶ | R⁷ | R⁸ | R¹⁰ | R¹³ |
|---|---|---|---|---|---|
| P-17 | H | H | H | H | Ph- |
| P-18 | H | H | H | H | tBu- |
| P-19 | H | H | H | H | —OCH₂CH₃ |
| P-20 | H | H | H | H | Ph-S-CH₂— |
| P-21 | H | H | H | H | —O-Ph |
| P-22 | CH₃ | H | H | CH₃ | Ph- |
| P-23 | Cl | H | H | H | Ph- |

(C type)

[Pyridine with R⁶, R⁷, R⁸, R⁹ substituents and CH₂-O-C(=O)-R¹³ group]

| | R⁶ | R⁷ | R⁸ | R⁹ | R¹³ |
|---|---|---|---|---|---|
| P-24 | H | H | H | H | Ph-S-CH₂— |

(C type)

| | R⁶ | R⁷ | R⁸ | R⁹ | R¹³ |
|---|---|---|---|---|---|
| P-25 | Cl | H | H | tBu | Ph-S-CH₂— |
| P-26 | H | H | H | H | CH₂=CH—CH— |
| P-27 | H | H | H | H | CH=CH—CH₂— |
| P-28 | H | H | H | H | Ph- |
| P-29 | H | H | H | H | 4-NO₂-C₆H₄- |
| P-30 | H | H | H | H | C₅H₁₁—C(=O)—CH₃ (acetyl pentyl) |
| P-31 | H | H | H | H | cyclopropyl |
| P-32 | H | H | H | H | -C(Ph)(Ph)-OH |
| P-33 | H | H | H | H | CH₃CH₂O— |

(D type)

P-34: 2,6-bis(benzoyloxymethyl)pyridine

P-35: 2,3-bis(benzoyloxymethyl)pyridine

P-36: 2,4-bis(benzoyloxymethyl)pyridine

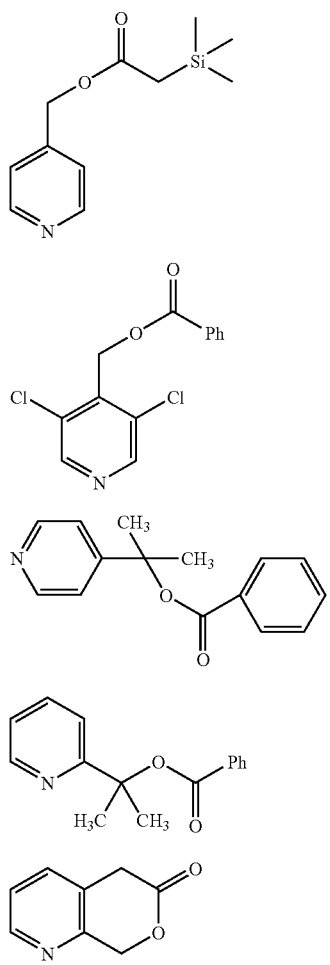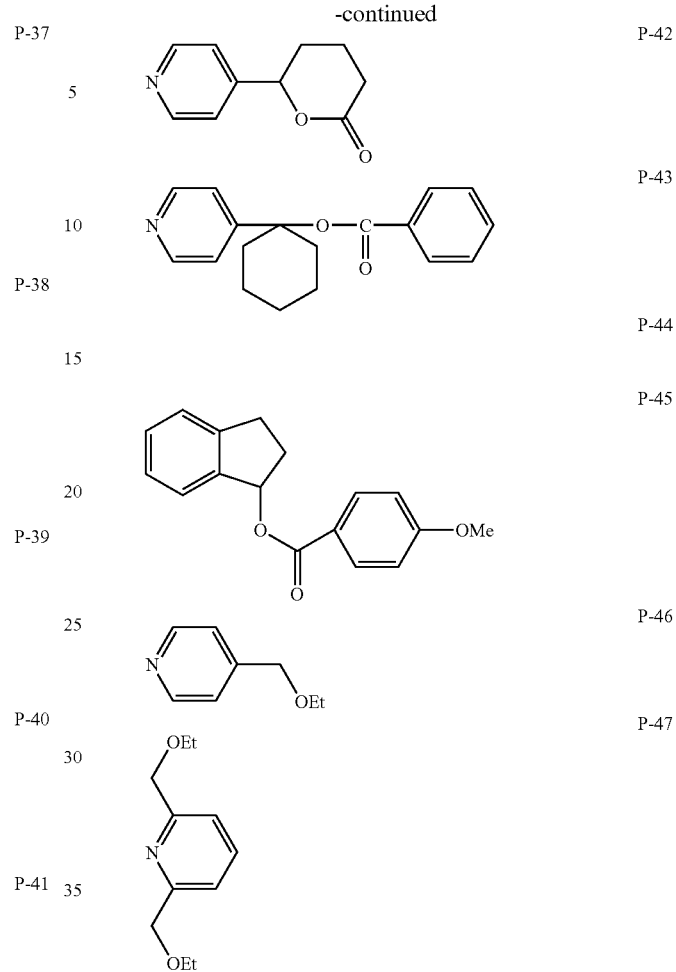
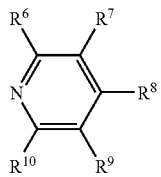
(E-type)
| | R⁶ | R⁷ | R⁸ | R⁹ | R¹⁰ |
|---|---|---|---|---|---|
| P-48 | H | H | —CH₂—O—C(=O)—C(=O)—Ph | H | H |
| P-49 | Cl | H | —CH₂—O—C(=O)—C(=O)—Ph | H | H |
| P-50 | H | CH₃ | —CH₂—O—C(=O)—C(=O)—Ph | H | H |
| P-51 | H | H | —CH₂—O—C(=O)—C(=O)—C₇H₁₅ | H | H |

-continued (E-type)

[Pyridine structure with R6, R7, R8, R9, R10 substituents]

| | R6 | R7 | R8 | R9 | R10 |
|---|---|---|---|---|---|
| P-52 | H | H | H | —CH$_2$—O—C(=O)—C(=O)—Ph | H |
| P-53 | CH$_3$ | H | H | —CH$_2$—O—C(=O)—C(=O)—Ph | H |
| P-54 | H | H | H | H | —CH$_2$—O—C(=O)—C(=O)—Ph |
| P-55 | H | H | H | H | —CH$_2$—O—C(=O)—C(=O)—Me |
| P-56 | —CH$_2$—O—C(=O)—C(=O)—Ph | H | H | H | —CH$_2$—O—C(=O)—C(=O)—Ph |
| P-57 | H | H | —CH$_2$—O—C(=O)—C(=O)—C$_6$H$_4$—OCH$_3$ | H | H |
| P-58 | H | H | —CH$_2$—O—C(=O)—C(=O)—C$_6$H$_4$—CF$_3$ | H | H |

(F type)

[4-pyridyl-CH$_2$—O—SO$_2$—R$^{13}$]

| | R$^{13}$ |
|---|---|
| P-59 | Ph- |
| P-60 | PhCH$_2$— |
| P-61 | Ph- |
| P-62 | C$_5$H$_{11}$— |
| P-63 | Ph- |

(G type)

[4-pyridyl-CH(R)—NH—C(=O)—R$^{13}$]

| | R$^{13}$ | R |
|---|---|---|
| P-64 | CH$_3$— | H |
| P-65 | Ph- | H |
| P-66 | Ph- | CH$_3$ |
| P-67 | CH$_3$— | H |
| P-68 | $^i$Pr— | H |

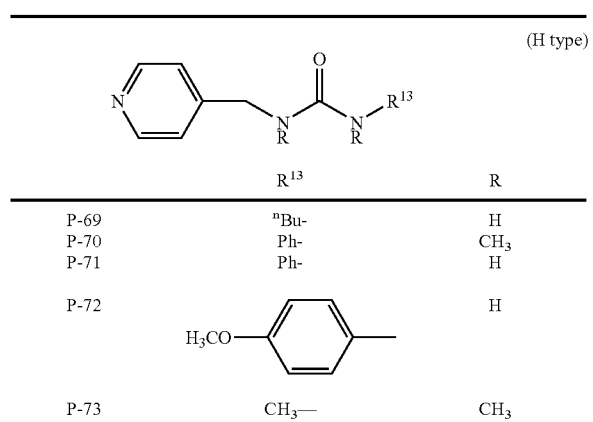

| | R[13] | R |
|---|---|---|
| P-69 | nBu- | H |
| P-70 | Ph- | CH$_3$ |
| P-71 | Ph- | H |
| P-72 | H$_3$CO-⟨phenyl⟩- | H |
| P-73 | CH$_3$- | CH$_3$ |

The method of using the pyridine compound can be appropriately arranged depending on characteristic design of the photosensitive material. With respect to the amount of the pyridine compound used, the larger amount is ordinarily more advantageous in view of the sensitivity. For instance, in the case of using the pyridine compound as a material for the photosensitive layer of lithographic printing plate precursor, the amount is preferably from 0.5 to 80 parts by weight, more preferably from 1 to 50 parts by weight, based on 100 parts by weight of the component of the photosensitive layer in order to obtain the sufficient sensitivity.

(A2) Cyan Compound

The cyan compound for use in the invention is a compound represented by the following formula (3):

wherein $R^{1'}$, $R^{2'}$ and $R^{3'}$ each independently represents a hydrogen atom, a halogen atom or an organic group, or $R^{1'}$ and $R^{2'}$, $R^{2'}$ and $R^{3'}$, or $R^{1'}$ and $R^{3'}$ may be combined with each other to form a ring; and L represents a divalent connecting group containing a hetero atom.

The organic group represented by any one of $R^{1'}$, $R^{2'}$ and $R^{3'}$ includes, for example, an alkyl group, a substituted alkyl group, an aryl group, a substituted aryl group, an alkenyl group, a substituted alkenyl group, an alkynyl group, a substituted alkynyl group, a hydroxy group, a substituted oxy group, a mercapto group a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group and a silyl group.

Preferably, $R^{1'}$ and $R^{2'}$ each independently represents a hydrogen atom, a halogen atom, an alkyl group, a substituted alkyl group, an aryl group, a substituted aryl group, an alkenyl group, a substituted alkenyl group, an alkynyl group, a substituted alkynyl group, a hydroxy group, a substituted oxy group, a mercapto group a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group. Specific examples and specific preferred examples of these groups include the specific examples and specific preferred examples described for $R^1$ to $R^5$ in the compound represented by formula (1), respectively.

$R^{3'}$ in formula (3) preferably represents a hydrogen atom, a halogen atom, an alkyl group, a substituted alkyl group, an aryl group, a substituted aryl group, an alkenyl group, a substituted alkenyl group, an alkynyl group, a substituted alkynyl group, a hydroxy group, a substituted oxy group, a mercapto group, a substituted thio group, an amino group or a substituted amino group.

Of the groups for $R^{1'}$ and $R^{2'}$ illustrated above, a hydrogen atom, a halogen atom (e.g., fluorine, bromine, chlorine or iodine), an alkyl group, a substituted alkyl group, an aryl group, a substituted aryl group, a substituted oxy group, a substituted thio group, a substituted amino group, a substituted carbonyl group, a sulfo group, a sulfonato group and a cyano group are more preferred, and a hydrogen atom, a halogen atom, an alkyl group, a substituted alkyl group, an aryl group and a substituted carbonyl group are still more preferred.

Preferred examples of the group for $R^{3'}$ are described below. Preferred examples of the alkyl group, substituted alkyl group, aryl group, substituted aryl group, alkenyl group, substituted alkenyl group, alkynyl group, substituted alkynyl group, hydroxy group, substituted oxy group, mercapto group, substituted thio group, amino group and substituted amino group include the preferred examples thereof described for $R^1$ to $R^5$ in the compound represented by formula (1), respectively. More preferred examples for $R^{3'}$ include an alkyl group, a substituted alkyl group, an aryl group, a substituted aryl group and an alkenyl group.

Now, the cyclic structure formed by combining $R^{1'}$ and $R^{2'}$, $R^{2'}$ and $R^{3'}$, or $R^{1'}$ and $R^{3'}$ with each other is described below. Examples of the cyclic structure include a saturated or unsaturated aliphatic ring formed by combining $R^{1'}$ and $R^{2'}$, $R^{2'}$ and $R^{3'}$, or $R^{1'}$ and $R^{3'}$ with each other, preferably a 5-membered, 6-membered, 7-membered or 8-membered aliphatic ring formed together with carbon atoms to which $R^{1'}$, $R^{2'}$ and $R^{3'}$ are connected, and more preferably a 5-membered or 6-membered aliphatic ring. The aliphatic ring may have one or more substituents (examples thereof include the substituents for the substituted alkyl group described above) on one or more carbon atoms constituting the ring. Also, a part of the ring-constituting carbon atoms may be replaced by hetero atom(s) (for example, an oxygen atom, a sulfur atom or a nitrogen atom). Further, the aliphatic ring may be condensed with an aromatic ring. Preferred examples thereof include a cyclopentane ring, a cyclohexane ring, a cycloheptane ring, a cyclooctane ring, a cyclo-1,3-dioxapentane ring, a cyclopentene ring, a cyclohexene ring, a cycloheptene ring, a cyclooctene ring, a cyclo-1,3-dioxapentene ring, a cyclo-1,3-dioxahexene ring, a cyclohexadiene ring, a benzocyclohexene ring, a benzocyclohexadiene ring and a tetrahydropyranone ring.

Examples of the cyclic structure also include an aromatic ring formed by combining $R^{1'}$, and $R^{2'}$, $R^{2'}$ and $R^{3'}$, or $R^{1'}$ and $R^{3'}$ with each other. Examples of the aromatic ring preferably include a quinoline ring, an isoquinoline ring, an acridine ring, a phenanthridine ring, a benzoquinoline ring and a benzisoquinoline ring, and more preferably a quinoline ring. The aromatic ring may have one or more substituents (examples thereof include the substituents for the substituted alkyl group described above) on one or more carbon atoms constituting the ring.

In the compound represented by formula (3), L has the same meaning as L in the compound represented by formula (1).

Preferred specific examples of the compound represented by formula (3) are set forth below, but the invention should not be construed as being limited thereto.

(Type A)

| | $R^1$ | $R^2$ | $R^3$ |
|---|---|---|---|
| C-1 | H | H | 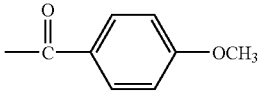 —C(=O)—Ph |
| C-2 | H | H | 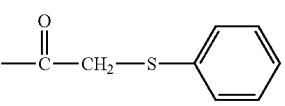 —C(=O)—C6H4—OCH3 |
| C-3 | H | H | 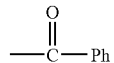 —C(=O)—CH2—S—Ph |
| C-4 | CH3 | CH3 |  —C(=O)—Ph |
| C-5 | H | H | -Ph |
| C-6 | H | H | 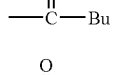 —C(=O)—Bu |
| C-7 | H | H | 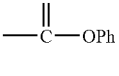 —C(=O)—OPh |
| C-8 | H | H | 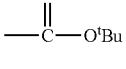 —C(=O)—O$^t$Bu |
| C-9 | H | CH3 | -Ph |
| C-10 | H | H |  —C(=O)—C(Ph)(Ph)(OH) |
| C-11 | H | H | 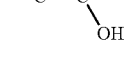 —C(=O)—CH2—O—Ph |
| C-12 | H | H | 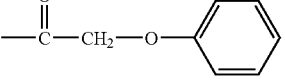 —C(=O)—C6H4—CF3 |
| C-13 | CH3 | CH3 | 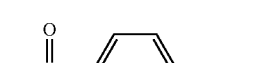 —C(=O)—CH2—S—Ph |

-continued (Type A)

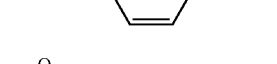

| | $R^1$ | $R^2$ | $R^3$ |
|---|---|---|---|
| C-14 | H | CH3 | 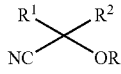 —C(=O)—Ph |
| C-15 | H | H | 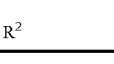 —C(=O)—NH—CH3 |
| C-16 | CH3 | CH3 | 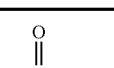 —C(=O)—C(Ph)(Ph)(OH) |
| C-17 | H | H | 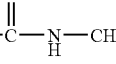 —C(=O)—C(=O)—Ph |
| C-18 | CH3 | H | 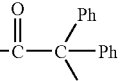 —C(=O)—OPh |
| C-19 | CH3 | H | 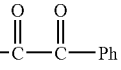 —C(=O)—O—$^t$Bu |
| C-20 | CH3 | CH3 | 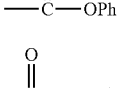 —C(=O)—C(=O)—Ph |
| C-21 | H | CH3 | 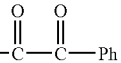 —C(=O)—CH2—O—Ph |
| C-22 | H | H | 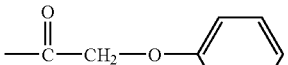 —C(=O)—C(Ph)(Ph)(OCH3) |
| C-23 | H | H | 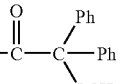 —C(=O)—CH3 |
| C-24 | H | H | 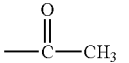 —C(=O)—N(CH3)(Ph) |
| C-25 | H | CH3 | 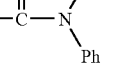 —C(=O)—C6H4—OCH3 |
| C-26 | H | H | 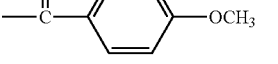 —C(=O)—C(=O)—CH3 |
| C-27 | H | H | 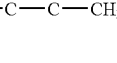 —C(=O)—C(=O)—C6H4—OCH3 |
| C-28 | H | H | 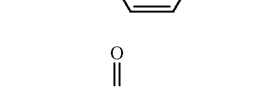 —C(=O)—OEt |

-continued (Type A)

| | $R^1$ | $R^2$ | $R^3$ |
|---|---|---|---|
| C-29 | CH₃ | CH₃ | —C(=O)—C₆H₄—CF₃ (para) |
| C-30 | H | H | —C(=O)—CH₂—S—C₆H₄—Cl (para) |
| C-31 | CH₃ | CH₃ | —C(=O)—N(morpholino) |
| C-32 | CH₃ | CH₃ | —C(=O)—C(Ph)(Ph)(OCH₃) |

(Type B)

C-33: cyclohexyl-C(CN)(O—C(=O)—Ph)

C-34: cyclohexyl-C(CN)(O—C(=O)—C(=O)—Ph)

C-35: cyclohexyl-C(CN)(OPh)

C-36: cyclohexyl-C(CN)(O—C(=O)—CH₂—S—Ph)

C-37: cyclohexyl-C(CN)(O—C(=O)—C(=O)—C₆H₄—OCH₃)

C-38: cyclohexyl-C(CN)(O—C(=O)—CH₂—O—Ph)

C-39: cycloheptyl-C(CN)(O—C(=O)—Ph)

(Type C)

C-40: NC—CH₂—O—C(=O)—C₆H₄—C(=O)—O—CH₂—CN (para)

C-41: NC—CH₂—O—C(=O)—CH₂—CH₂—C(=O)—O—CH₂—CN

C-42: (CH₃)₂C(CN)—O—C(=O)—C₆H₄—C(=O)—O—C(CN)(CH₃)₂ (para)

C-43: NC—CH₂—O—C(=O)—C₆H₄—C(=O)—O—CH₂—CN (ortho)

C-44: cyclohexyl(CN)—O—C(=O)—C₆H₄—C(=O)—O—(CN)cyclohexyl (ortho)

-continued

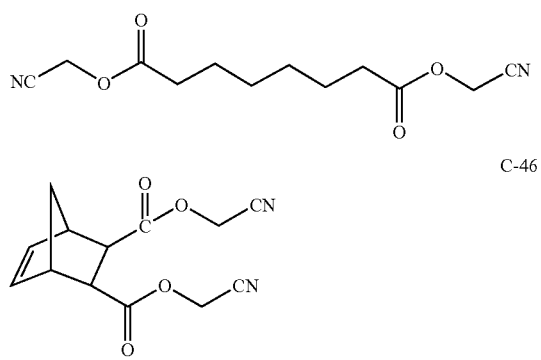

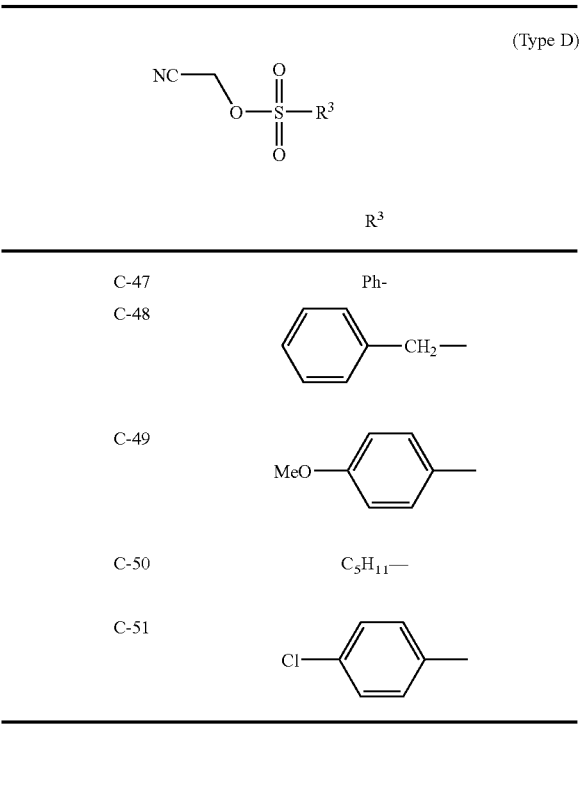

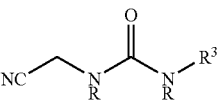

| | R³ | R |
|---|---|---|
| C-57 | Ph | H |
| C-58 | ⁿBu | H |
| C-59 | Ph | CH₃ |
| C-60 | CH₃ | H |
| C-61 | 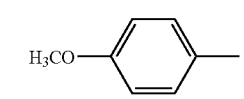 | H |

The method of using the cyan compound can be appropriately arranged depending on characteristic design of the photosensitive material. With respect to the amount of the cyan compound used, the larger amount is ordinarily more advantageous in view of the sensitivity. For instance, in the case of using the cyan compound as a material for the photosensitive layer of lithographic printing plate precursor, the amount is preferably from 0.5 to 80 parts by weight, more preferably from 1 to 50 parts by weight, based on 100 parts by weight of the component of the photosensitive layer in order to obtain the sufficient sensitivity.

(A3) Titanocene Compound

The titanocene compound for use in the invention may be any titanocene compound as long as it is capable of generating an active species upon irradiation with light in the region of from 350 to 450 nm, and can be appropriately selected from known compounds described, for example, in JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl and bis(cyclopentadienyl)-bis(2,6-difluoro-3-(pir-1-yl)phenyl)titanium.

Similar to the above-described pyridine compound or cyan compound, the method of using the titanocene compound can be appropriately arranged depending on characteristic design of the photosensitive material. For example, by using two or more kinds of titanocene compounds, the compatibility in the photosensitive layer can be improved. With respect to the amount of the titanocene compound used, the larger amount is ordinarily more advantageous in view of the sensitivity. For instance, in the case of using the titanocene compound as a material for the photosensitive layer of lithographic printing plate precursor, the amount is preferably from 0.5 to 80 parts by weight, more preferably from 1 to 50 parts by weight, based on 100 parts by weight of the component of the photosensitive layer in order to obtain the sufficient sensitivity. However, in the case of using the titanocene compound, which itself has absorption in a visible range, under a yellow lamp or white lamp, the amount thereof is preferably smaller in view of preventing fog due to light in the vicinity of 500 nm. Specifically, the amount of titanocene used is preferably 6 parts by weight or less, more preferably 1.9 parts by weight or less, and the sufficient sensitivity can be obtained even if the amount of titanocene used is reduced to 1.4 parts by weight or less.

It is preferred in the photo-initiation system according to the invention to use a sensitizing dye for the purpose of increasing the photosensitivity. Preferred examples of the sensitizing dye are illustrated below.

(A4) Sensitizing Dye

Preferred examples of the sensitizing dye used in the invention include sensitizing dyes, which have an absorption wavelength in the region of from 350 to 450 nm and belong to the following compounds: multi-nucleus aromatic compounds (for example, pyrene, perylene or triphenylene), xanthenes (for example, Fluoresceine, Eosine, Erythrocin, Rhodamine B or Rose Bengale), cyanines (for example, thiacarbocyanine or oxacarbocyanine), merocyanines (for example, merocyanine or carbomerocyanine), thiazines (for example, Thionine, Methylene Blue or Toluidine blue), acridines (for example, Acridine Orange, chloroflavine or acriflavine), anthraquinones (for example, anthraquinone), and squaliums (for example, squalium).

More preferred examples of the sensitizing dye include compounds represented by formulae (XIV) to (XVIII) shown below.

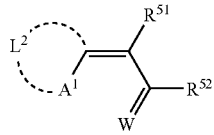
(XIV)

In formula (XIV), $A^1$ represents a sulfur atom or $NR^{50}$, $R^{50}$ represents an alkyl group or an aryl group, $L^2$ represents a non-metallic atomic group necessary for forming a basic nucleus of the dye together with adjacent $A^2$ and the adjacent carbon atom, $R^{51}$ and $R^{52}$ each independently represents a hydrogen atom or a monovalent non-metallic atomic group or $R^{51}$ and $R^{52}$ may be combined with each other to form an acidic nucleus of the dye, and W represents an oxygen atom or sulfur atom.

Preferred specific examples of the compound represented by formula (XIV) are set forth below.

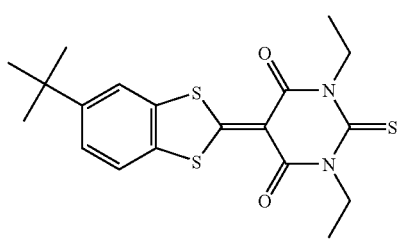
(A-1)

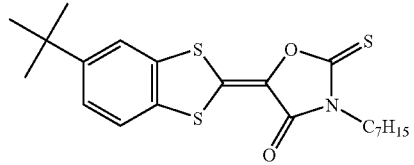
(A-2)

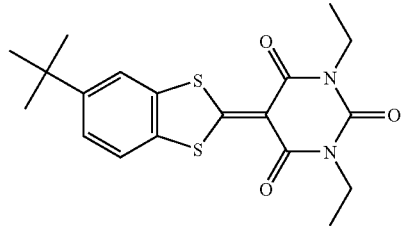
(A-3)

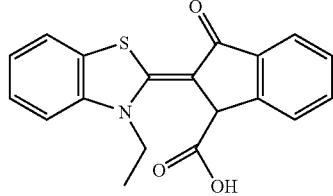
(A-4)

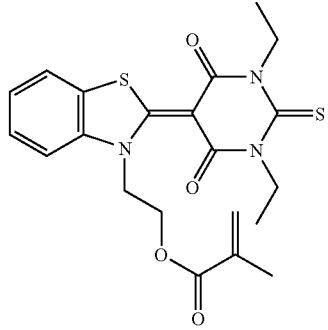
(A-5)

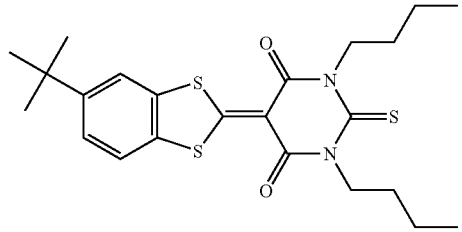
(A-6)

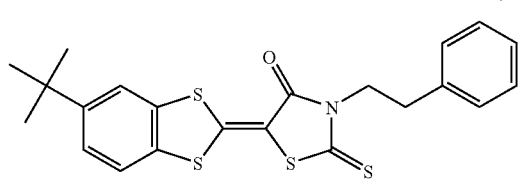
(A-7)

-continued (A-8)
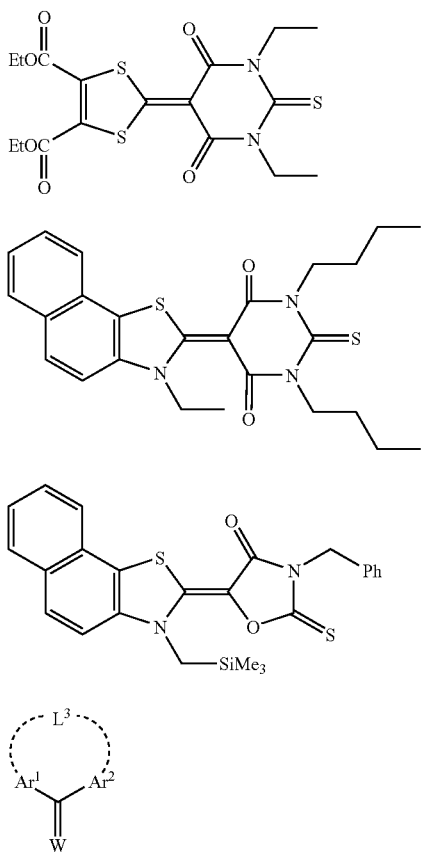

(A-9)

(A-10)

(XV)

In formula (XV), Ar¹ and Ar¹ each independently represents an aryl group and are connected through —L³—, L³ represents —O— or —S—, and W has the same meaning as defined in formula (XIV).

Preferred specific examples of the compound represented by formula (XV) are set forth below.

(A-11)
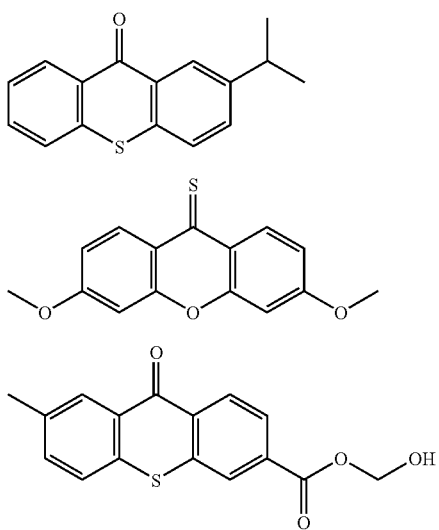

(A-12)

(A-13)

-continued (A-14)
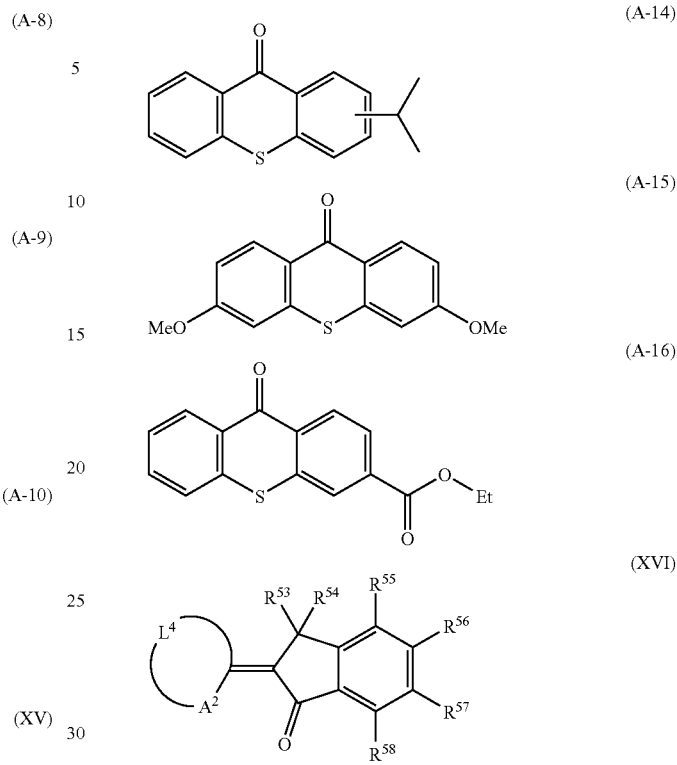

(A-15)

(A-16)

(XVI)

In formula (XVI), A² represents a sulfur atom or NR⁵⁹, L⁴ represents a non-metallic atomic group necessary for forming a basic nucleus of the dye together with adjacent A² and the adjacent carbon atom, $R^{53}$, $R^{54}$, $R^{55}$, $R^{56}$, $R^{57}$ and $R^{58}$ each independently represents a monovalent non-metallic atomic group, and $R^{59}$ represents an alkyl group or an aryl group.

Preferred specific examples of the compound represented by formula (XVI) are set forth below.

(A-17)
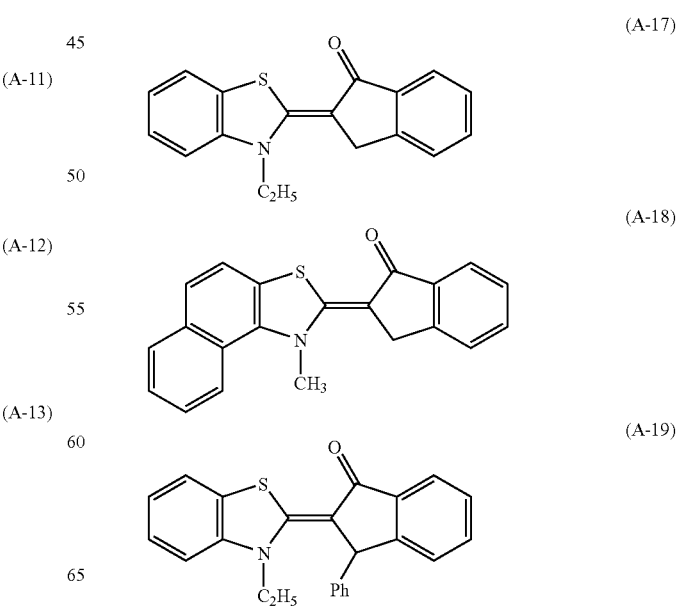

(A-18)

(A-19)

-continued

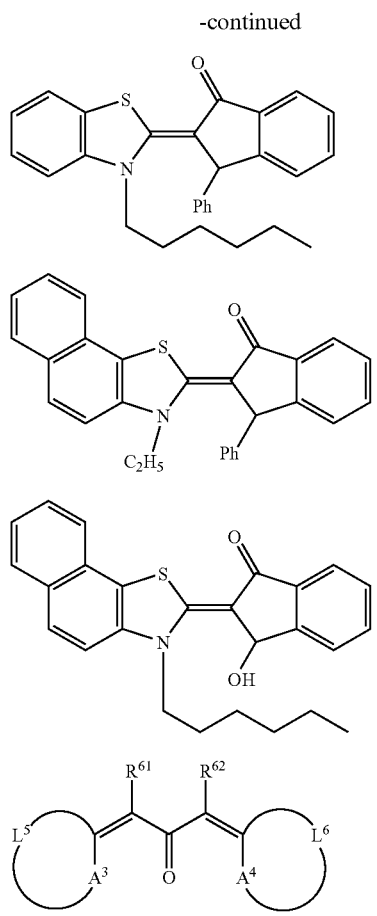

(A-20)
(A-21)
(A-22)

(XVII)

In formula (XVII), $A^3$ and $A^4$ each independently represents —S—, —$NR^{63}$— or —$N^{64}$—, $R^{63}$ and $R^{64}$ each independently represents a substitute or unsubstituted alkyl group or a substitute or unsubstituted aryl group, $L^5$ and $L^6$ each independently represents a non-metallic atomic group necessary for forming a basic nucleus of the dye together with adjacent $A^3$ or $A^4$ and the adjacent carbon atom, $R^{61}$ and $R^{62}$ each independently represents a monovalent non-metallic atomic group, or $R^{61}$ and $R^{62}$ may be combined with each other to form an aliphatic or aromatic ring.

Preferred specific examples of the compound represented by formula (XVII) are set forth below.

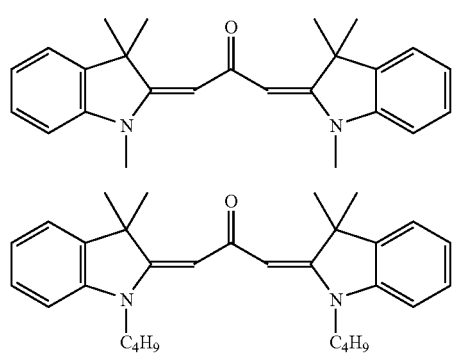

(A-23)
(A-24)

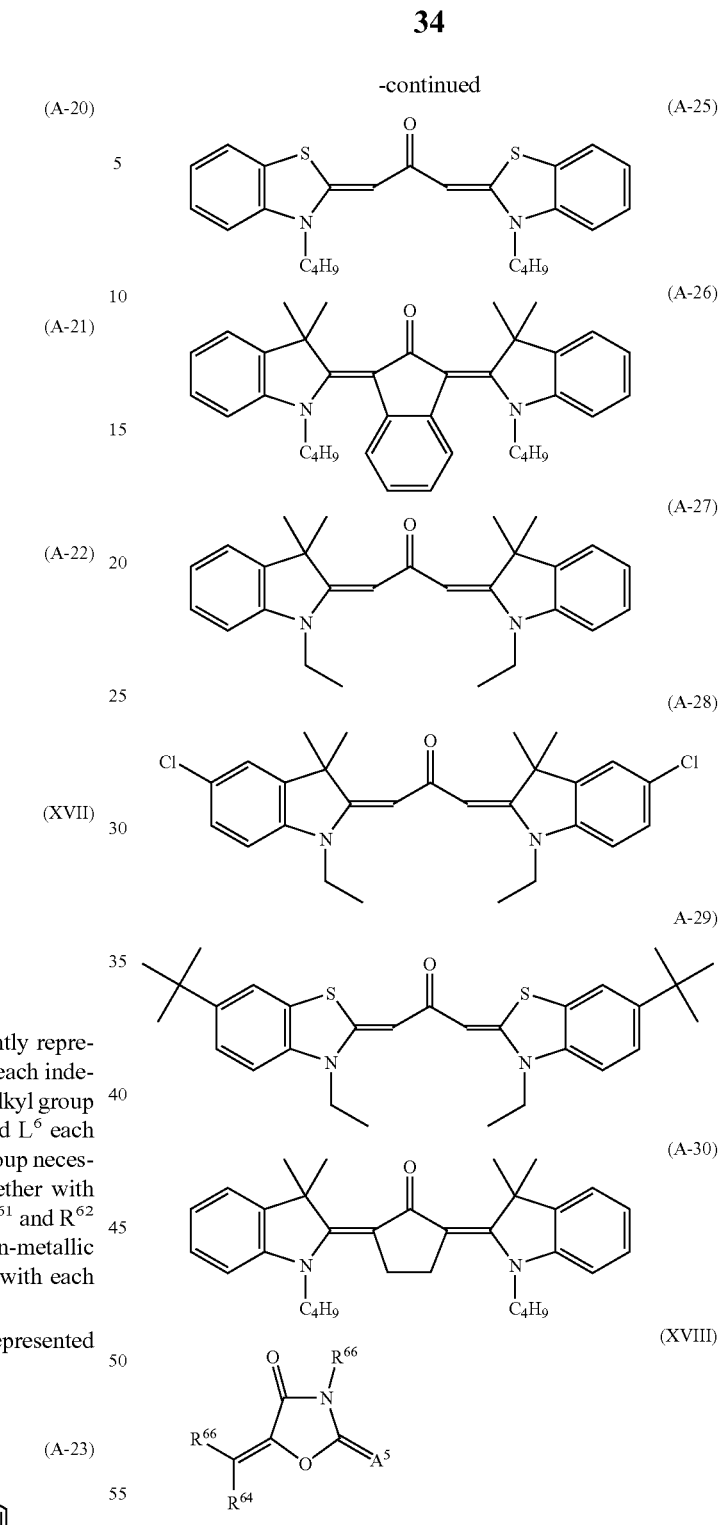

(A-25)
(A-26)
(A-27)
(A-28)
(A-29)
(A-30)
(XVIII)

In formula (XVIII), $R^{66}$ represents an aromatic ring that may have a substituent or a hetero ring that may have a substituent, $A^5$ represents an oxygen atom, a sulfur atom or —$NR^{67}$—, $R^{64}$, $R^{65}$ and $R^{67}$ each independently represents a hydrogen atom or a monovalent non-metallic atomic group, or $R^{67}$ and $R^{64}$ or $R^{65}$ and $R^{67}$ may be combined with each other to form an aliphatic or aromatic ring.

Preferred specific examples of the compound represented by formula (XVIII) are set forth below.

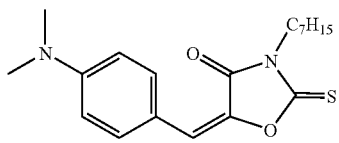
(A-31)

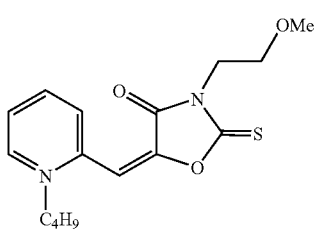
(A-32)

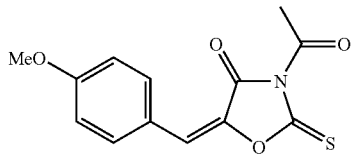
(A-33)

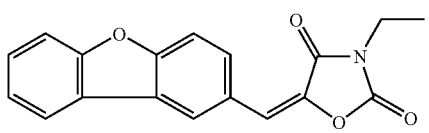
(A-34)

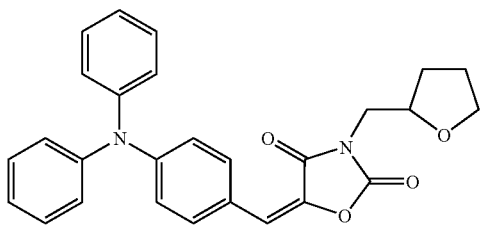
(A-35)

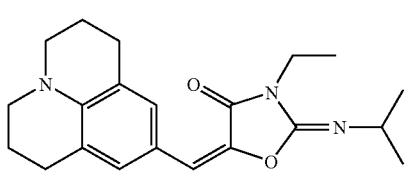
(A-36)

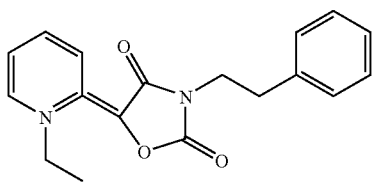
(A-37)

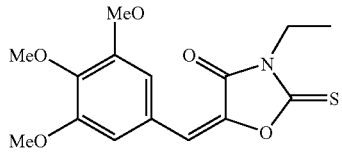
(A-38)

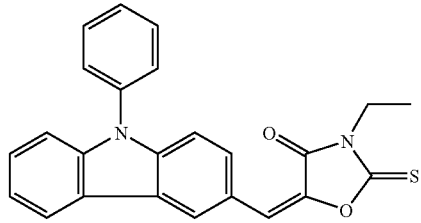
(A-39)

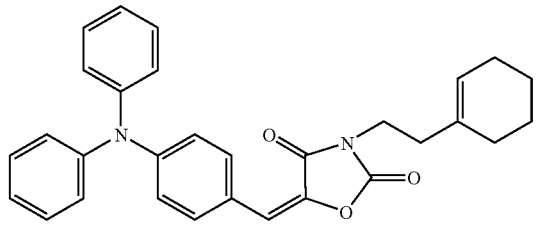
(A-40)

The sensitizing dye may be subjected to various chemical modifications in order to improve the characteristics of a photosensitive layer when it is used in a lithographic printing plate precursor. For instance, the sensitizing dye may be connected to an addition-polymerizable compound structure (for example, an acryloyl group or a methacryloyl group) by a covalent bond, ionic bond, hydrogen bond or the like, whereby strength of the exposed area of the photosensitive layer can be increased and undesirable deposition of the dye in the photosensitive layer after exposure can be inhibited.

Also, in the case of using the photosensitive composition of the invention for the preparation of a lithographic printing plate precursor, introduction of a hydrophilic site (an acid group or a polar group, for example, a carboxyl group or an ester thereof, a sulfonic group or an ester thereof, or an ethylene oxide group) to the dye is effective for the purpose of enhancing the processing aptitude with an (alkali) aqueous developer, which is a preferred embodiment for the photosensitive layer. Particularly, an ester-type hydrophilic group has a feature in that it exhibits excellent compatibility in the photosensitive layer due to the relatively hydrophobic structure and in the developer, it is hydrolyzed to generate an acid group, thereby increasing hydrophilicity. In addition, a substituent can be appropriately introduced, for example, for improving the compatibility or inhibiting the deposition of crystal in the photosensitive layer. For instance, in a certain kind of photosensitive system, an unsaturated bond, for example, in an aryl group or an allyl group is sometimes very effective for improving the compatibility. Furthermore, the formation of a steric hindrance between π planes of the dyes by a method, for example, introduction of a branched alkyl structure can significantly inhibit the deposition of crystal. Also, adhesion to metal or an inorganic material, for example, metal oxide can be improved by the introduction of a phosphonic acid group, an epoxy group, a trialkoxysilyl group or the like. If desired, a method of polymerization of the sensitizing dye may also be used.

Details of the method of using the sensitizing dye, for example, selection of the structure, individual or combination use, or an amount added, can be appropriately arranged depending on the characteristic design of the final photosensitive material. For instance, when two or more sensitizing dyes are used in combination, the compatibility with the photosensitive composition layer can be enhanced. For the selection of sensitizing dye, the molar absorption coefficient thereof at the emission wavelength of the light source used is an important factor in addition to the photosensitivity. Use of the dye having a large molar absorption coefficient is profitable, because the amount of dye added can be made relatively small. Also, in the case of preparing a lithographic printing plate precursor, the use of the dye is advantageous in view of the physical properties of the photosensitive layer. Since the photosensitivity and resolution of the photosensitive layer and the physical properties of the exposed area of the photosensitive layer are greatly influenced by the absorbance at the wavelength of light source, the amount of the sensitizing dye added is appropriately selected in consideration of these factors. For instance, in a low absorbance region of the photosensitive layer of 0.1 or less, the sensitivity decreases. Also, the resolution decreases due to the influence of halation.

However, for the purpose of hardening a layer having a large thickness of 5 μm or more, such low absorbance is sometimes rather effective for increasing the hardening degree. On the other hand, in a high absorbance region of 3 or more, the light is mostly absorbed on the surface of the photosensitive layer to inhibit hardening of the inner part and as a result, for example, when a printing plate is produced, the layer strength and the adhesion to a substrate become insufficient. In the case of using in a lithographic printing plate precursor where a photosensitive layer has a relatively small thickness, the amount of the sensitizing dye added is preferably selected such that the photosensitive layer has absorbance of 0.1 to 1.5, preferably from 0.25 to 1. Specifically, in the case of using in a lithographic printing plate precursor, the amount of the sensitizing dye added is ordinarily from 0.05 to 30 parts by weight, preferably from 0.1 to 20 parts by weight, and more preferably from 0.2 to 10 parts by weight, per 100 parts by weight of the component of the photosensitive layer.

<B. Component (iii)>

The third essential component (iii) of the photosensitive composition of the invention is a compound capable of undergoing a reaction with at least one of a radical and an acid to irreversibly change its physical or chemical property. Any compound can be appropriately used without any particular limitation as long as the compound has such a property. For instance, the compounds described above for the initiation system each itself has such a property in many cases. The property of the component (iii), which is changed by any one of a radical and an acid generated from the photo-initiation system, includes a molecular physical property, for example, absorption spectrum (color), chemical structure or polarizability, and a physical property of the material, for example, solubility, strength, refractive index, fluidity or adhesion property.

For instance, when a compound of changing in the absorption spectrum due to pH, for example, a pH indicator, is used as the component (iii) and an acid is generated from the initiation system, the color tone can be changed only in the exposed area. Such a composition is useful as an image forming material. Similarly, when a compound of changing in the absorption spectrum according to oxidation-reduction or nucleophilic addition reaction is used as the component (iii), oxidation, reduction or the like is induced by a radical generated from the initiation system, whereby image formation can be effected. Examples thereof are described, for example, in *J. Am. Chem. Soc.*, 108, 128 (1986), *J. Imaging Sci.*, 30, 215 (1986) and *Israel. J. Chem.*, 25, 264 (1986).

Also, a photocurable resin or a negative working photopolymer can be formed by using an addition-polymerizable or condensation-polymerizable compound as the component (iii) in combination with the initiation system.

As the component (iii), a radical polymerizable compound (for example, a compound having an ethylenically unsaturated bond), a cationic polymerizable compound (for example, an epoxy compound, a vinyl ether compound or a methylol compound) or an anionic polymerizable compound (for example, an epoxy compound) is used. Examples thereof are described, for example, in *Photopolymer Handbook*, edited by Photopolymer Konwakai, published by Kogyo Chosakai (1989) and *Kobunshi (Polymer)*, 45, 786 (1996). A composition in which a thiol compound is used as the component (iii) in combination with a photo-radical generation system is also well known.

It is also effective to use an acid-decomposable compound as the component (iii) in combination with a photo-acid generator. For instance, a material which uses a polymer having a side chain or main chain decomposable with an acid and changes in the solubility or hydrophilic/hydrophobic property by light is broadly used in practice as a photodecomposable photosensitive resin or a positive working photopolymer. Specific examples thereof include those described, for example, in *ACS. Symp. Ser.*, 242, 11 (1984), JP-A-60-3625, U.S. Pat. Nos. 5,102,771, 5,206,317 and 5,212,047, JP-A426850, JP-A-3-192173, JP-A-60-10247 and JP-A-62-40450.

The addition-polymerizable compound having an ethylenically unsaturated double bond as the component (iii) particularly advantageous for the purpose of obtaining a high-sensitive lithographic printing plate precursor, which is one of the objects of the invention, is described in detail below.

(B-1) Addition-Polymerizable Compound

The addition-polymerizable compound having at least one ethylenically unsaturated double bond, as the component (iii) preferably used in the invention, is selected from compounds having at least one, preferably two or more, terminal ethylenically unsaturated double bonds. Such compounds are broadly known in the field of art and they can be used in the invention without any particular limitation. The compound has a chemical form, for example, a monomer, a prepolymer, specifically, a dimer, a trimer or an oligomer or a mixture thereof, or a copolymer thereof. Examples of the monomer include unsaturated carboxylic acids (for example, acrylic acid, methacrylic acid, itaconic acid, crotonic acid, isocrotonic acid, maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Furthermore, an addition reaction product of an unsaturated carboxylic acid ester or amide having an electrophilic substituent, for example, an isocyanato group or an epoxy group with a monofunctional or polyfunctional alcohol, amine or thiol, or a substitution reaction product of an unsaturated carboxylic acid ester or amide having a releasable substituent, for example, a halogen group or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate or polyester acrylate oligomer; methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythitol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)-phenyl]dimethylmethane; itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; crotonic acid esters, for example, ethylene glycol dicrotonate, tetramethylene glycol dicrotonate, pentaerythritol dicrotonate or sorbitol tetradicrotonate; isocrotonic acid esters, for example, ethylene glycol diisocrotonate, pentaerythritol diisocrotonate or sorbitol tetraisocrotonate; and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-46-27926, JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which forms an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Other preferred examples of the amide monomer include amides having a cyclohexylene structure described in JP-B-54-21726.

Urethane type addition polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (III) shown below to a polyisocyanate compound having two or more isocyanate groups per molecule, described in JP-B-48-41708.

$$CH_2{=}C(R)COOCH_2CH(R')OH \qquad (III)$$

wherein R and R' each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 may be preferably used.

Furthermore, a photopolymerizable composition having remarkably excellent photosensitive speed can be obtained by using an addition-polymerizable compound having an amino structure or a sulfide structure per molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth) acrylic acid, described in JP-A-48-64183, JP-B-49-43191 and JP-B-52-30490. Specific unsaturated compounds described in JP-B3-46-43946, JP-B-1-40337 and JP-B-1-40336, and vinylphosphonic acid compounds described in JP-A-2-25493 can also be used. In some cases, structure containing a perfluoroalkyl group described in JP-A-61-22048 can be preferably used. Also, photocurable monomers or oligomers described in *Nippon Secchaku Kyokaishi (Journal of Japan Adhesion Society)*, Vol. 20, No. 7, pages 300 to 308 (1984) can be used.

Details of the method of using the addition-polymerizable compound, for example, selection of the structure, individual or combination use, or an amount added, can be appropriately arranged depending on the characteristic design of the final photosensitive material. For instance, the compound is selected from the following standpoints. In view of the photosensitive speed, a structure having a large content of unsaturated groups per molecule is preferred and in many cases, a bifunctional or greater functional group is preferred. For increasing the strength of image area, that is, hardened layer, a trifunctional or greater functional group is preferred. A combination use of compounds different in the functional number and in the polymerizable group (for example, an acrylic acid ester, a methacrylic acid ester, a styrene compound or a vinyl ether compound) is an effective method for controlling both the photosensitivity and the strength. A compound having a large molecular weight or a compound having high hydrophobicity is excellent in the photosensitive speed and layer strength but is not preferred in some cases in view of developing speed and deposition in the developer. The selection and use method of the addition-polymerizable compound are also important factors for the compatibility and dispersibility with other components (for example, a binder polymer, an initiator or a coloring agent) in the photosensitive layer. For instance, the compatibility may be improved in some cases by using the compound of low purity or using two or more of the compounds in combination. A specific structure may be selected for the purpose of improving the adhesion property to a support or an overcoat layer described hereinafter. With respect to a ratio of the addition-polymerizable compound in the photosensitive layer, a larger ratio is advantageous in view of sensitivity. However, if the ratio is too large, undesired phase separation may occur, and further, a problem (for example, production failure due to transfer or adhesion of the photosensitive material component) may arise in the production step due to the adhesion property of the photosensitive layer, and a problem of deposition in the developer may occur. In view of these standpoints, the ratio is in many cases preferably from 5 to 80 wt %, more preferably from 25 to 75 wt %, based on the total component of the photosensitive composition. The addition-polymerizable compounds may be used individually or in combination of two or more thereof. In the method of using the addition-polymerizable compound, the structure, blend and amount added can be appropriately selected by taking account of the degree of polymerization inhibition due to oxygen, resolution, fog, change in refractive index, surface adhesion and the like. Further, depending on the case, a layer construction, for example, undercoat or overcoat, and a coating method, may also be considered.

<C. Binder Polymer>

In the application to the lithographic printing plate precursor as a preferred embodiment of the invention, it is preferred to further use a binder polymer in the photosensitive composition. The binder polymer preferably includes a linear organic polymer. The "linear organic polymer" may be any linear organic polymer. Preferably, a linear organic polymer soluble or swellable in water or alkalescent water, which enables to conduct water development or alkalescent water development, is selected. The linear organic polymer is selected not only as a film forming agent of the composition but also considering the use of water, alkalescent water or an organic solvent as the developer. For instance, when a water-soluble organic polymer is used, water development can be performed. Examples of the linear organic polymer include addition polymers having a carboxylic acid group in the side chain, for example, methacrylic acid copolymers, acrylic acid copolymers, itaconic acid copolymers, crotonic acid copolymers, maleic acid copolymers and partially esterified maleic acid copolymers described in JP-A-59-44615, JP-B-54-34327, JP-B-58-12577, JP-B-54-25957, JP-A-54-92723, JP-A-59-53836 and JP-A-59-71048. Further, acidic cellulose derivatives having a carboxylic acid group in the side chain may also be used. In addition, polymers obtained by adding a cyclic acid anhydride to an addition polymer having a hydroxy group are also useful.

Among these, [benzyl (meth)acrylate/(meth)acrylic acid/if desired, other addition-polymerizable vinyl monomer] copolymers and [allyl (meth)acrylate/(meth)acrylic acid/if desired, other addition-polymerizable vinyl monomer] copolymers are preferred because of their excellent balance in the film strength, sensitivity and developing property.

Also, the acid group-containing urethane binder polymers described in JP-B-7-120040, JP-B-7-120041, JP-B-7-120042, JP-B-8-12424, JP-A-63-287944, JP-A-63-287947, JP-A-1-271741 and JP-A-11-352691 are advantageous in view of press life and low energy exposure aptitude because of their very excellent strength.

The binder having an amido group described in JP-A-11-171909 is preferred because it has both excellent developing property and film strength.

In addition, polyvinyl pyrrolidone, polyethylene oxide and the like are useful as the water-soluble linear organic polymer. Also, an alcohol-soluble nylon and a polyether of 2,2-bis(4-hydroxyphenyl)propane with epichlorohydrin are useful for the purpose of increasing the strength of hardened layer. The linear organic polymer can be mixed in an appropriate amount in the photosensitive composition. However, if the amount exceeds 90% by weight, preferred results may not be obtained in view of the image strength and the like. The amount added is preferably from 30 to 85% by weight. Also, the photopolymerizable compound having an ethylenically unsaturated double bond and the linear organic polymer are preferably used at a weight ratio of 1/9 to 7/3. In a preferred embodiment, the binder polymer used is substantially insoluble in water and soluble in alkali. By using such a binder polymer, an organic solvent, which is not desirable in view of environment, is not used in the developer or can be limited to a very small amount. In such a case, an acid value (acid content per g of polymer, expressed by the chemical equivalent number) and molecular weight of the binder polymer are appropriately selected by taking account of the image strength and the developing property. The acid value is preferably from 0.4 to 3.0 meq/g, more preferably from 0.6 to 2.0 meq/g, and the molecular weight is preferably from 3,000 to 500,000, more preferably from 10,000 to 300,000, in terms of a weight average molecular weight.

<D. Other Component>

To the photosensitive composition of the invention, other component suitable for its use, production method and the like may further appropriately added. Preferred additives are described below.

(D1) Co-Sensitizer

The sensitivity can be further elevated by using a certain additive (hereinafter referred to as a "co-sensitizer"). The operation mechanism is not quite clear but believed to be mostly based on the following chemical process. Specifically, the co-sensitizer reacts with various intermediate active species (for example, a radical, a peroxide, an oxidizing agent or a reducing agent) generated during the process of photoreaction initiated upon light absorption of the above-described initiation system and subsequent addition-polymerization reaction, to form new active radicals. Such compounds are roughly classified into (a) compound which is reduced to form an active radical, (b) compound which is oxidized to form an active radical and (c) compound which reacts with a radical having low activity to convert it into a more active radical or acts as a chain transfer agent. However, in many cases, a common view is not present about which compound belongs to which type.

(a) Compound Which is Reduced to Form an Active Radical

Compound Having Carbon—Halogen Bond:

It is believed that an active radical is generated by reductive cleavage of the carbon—halogen bond. Specific examples of the compound preferably used include trihalomethyl-s-triazines and trihalomethyloxadiazoles.

Compound Having Nitrogen—Nitrogen Bond:

It is believed that an active radical is generated by reductive cleavage of the nitrogen—nitrogen bond. Specific examples of the compound preferably used include hexaarylbiimidazoles.

Compound Having Oxygen—Oxygen Bond:

It is believed that an active radical is generated by reductive cleavage of the oxygen—oxygen bond. Specific examples of the compound preferably used include organic peroxides.

Onium Compound:

It is believed that an active radical is generated by reductive cleavage of carbon—hetero bond or oxygen—nitrogen bond. Specific examples of the compound preferably used include diaryliodonium salts, triarylsulfonium salts and N-alkoxypyridinium (azinium) salts.

Ferrocene and Iron Allene Complex:

An active radical can be reductively formed.

(b) Compound Which is Oxidized to Form an Active Radical

Alkylate Complex:

It is believed that an active radical is generated by oxidative cleavage of the carbon—hetero bond. Specific examples of the compound preferably used include triarylalkylborates.

Alkylamine Compound:

It is believed that an active radical is generated by oxidative cleavage of a C—X bond on the carbon atom adjacent to a nitrogen atom, wherein X is preferably a hydrogen atom a carboxyl group, a trimethylsilyl group or a benzyl group. Specific examples of the compound include ethanolamines, N-phenylglycines and N-trimethylsilylmethylanilines.

Sulfur-Containing or Tin-Containing Compound:

This is a compound in which the nitrogen atom of the above-described amine compound is replaced by a sulfur atom or a tin atom. An active radical is formed by the same function. Also, a compound having an S—S bond is known to effect sensitization by cleavage of the S—S bond.

α-Substituted Methylcarbonyl Compound:

An active radical is formed by oxidative cleavage of a carbonyl-α carbon bond. A compound in which the carbonyl is converted into an oxime ether also shows the same function. Specific examples of the compound include 2-alkyl-1-[4-(alkylthio)phenyl]-2-morpholinopronone-1 and oxime ethers thereof obtained by reaction of the compound with a hydroxyamine and subsequent etherification of N—OH.

Sulfinic Acid Salt:

An active radical is reductively formed. Specific examples of the compound include sodium arylsulfinate.

(c) Compound Which Reacts with a Radical to Convert It into a More Active Radical or Acts as a Chain Transfer Agent;

For example, a compound having SH, PH, SiH or GeH in its molecule is used. Such a compound donates hydrogen to a radical species having a low activity to form a radical or is oxidized and then deprotonized to form a radical. Specific examples of the compound include 2-mercaptobenzimidazoles.

A large number of examples of the co-sensitizers are more specifically described, for example, in JP-A-9-236913 as additives for the purpose of increasing sensitivity. A part of the compounds are set forth below, but the invention should not be construed as being limited thereto. In the formula shown below, —TMS denotes a trimethylsilyl group.

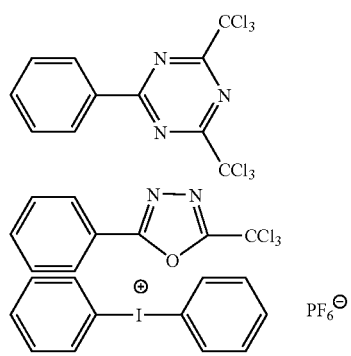

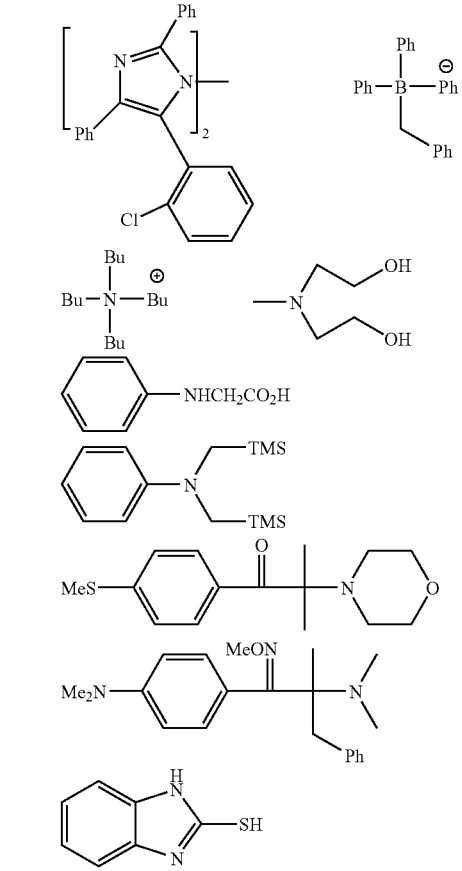

Similarly to the above-described sensitizing dye, the co-sensitizer can be subjected to various chemical modifications so as to improve the characteristics of the photosensitive layer. For instance, methods, for example, of connecting to the sensitizing dye, activator, addition-polymerizable unsaturated compound or other part, of introducing a hydrophilic site, of introducing a substituent for improving compatibility, inhibiting deposition of crystal or improving adhesion property, and of forming a polymer, may be used.

The co-sensitizers can be used individually or in combination of two or more thereof. The amount of the co-sensitizer used is from 0.05 to 100 parts by weight, preferably from 1 to 80 parts by weight, more preferably from 3 to 50 parts by weight, per 100 parts by weight of the compound having an ethylenically unsaturated double bond.

(D2) Polymerization Inhibitor

In the invention, a small amount of a thermal polymerization inhibitor is preferably added in addition to the above-described basic components, so as to prevent the polymerizable compound having an ethylenically unsaturated double bond from undergoing undesirable thermal polymerization during the production or storage of the photosensitive composition. Examples of suitable thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitrosophenylhydroxyamine cerium(III) salt. The amount of the thermal polymerization inhibitor added is preferably from about 0.01 to about 5% by weight, based on the weight of the entire composition. If desired, in order to prevent polymerization inhibition by oxygen, a higher fatty acid derivative, for example, behenic acid or behenic acid amide may be added and allowed to localize on the photosensitive layer surface during the drying step after the coating thereof. The amount of the higher fatty acid derivative added is preferably from about 0.5 to about 10% by weight based on the entire composition.

(D3) Coloring Agent and the Like

A dye or a pigment may be further added for the purpose of coloring the photosensitive layer. By such a coloring, so-called plate inspection, for example, visibility of printing plate after the plate-making or suitability for an image density meter can be improved. Since many dyes cause reduction in the sensitivity of photopolymerizable photosensitive layer, a pigment is preferably used as the coloring agent. Specific examples include pigments, for example, phthalocyanine pigment, azo pigment, carbon black and titanium oxide, and dyes, for example, Ethyl Violet, Crystal Violet, azo dye, anthraquinone dye and cyanine dye. The amount of the dye or pigment added is preferably from about 0.5 to about 5% by weight based on the entire composition.

(D4) Other Additives

Other known additives may be further added, for example, inorganic filler and plasticizer for improving physical properties of the hardened layer, and oil-sensitizer capable of improving the adhesion of ink of the photosensitive layer surface.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetylglycerol. In the case of using a binder, the plasticizer can be added in an amount of 10% by weight or less based on the total weight of the compound having an ethylenically unsaturated double bond and the binder.

Also, a UV initiator, a heat crosslinking agent and the like may be added for elevating the effect of heating or light exposure after the development for the purpose of improving the layer strength (press life) described hereinafter.

In addition, for improving the adhesion property between the photosensitive layer and a support or elevating the developing and removing property of the unexposed photo-sensitive layer, an additive may be added or an interlayer may be provided. For instance, a compound showing a relatively strong interaction with the substrate, for example, compound having a diazonium structure or phosphone compound may be added or undercoated, whereby the adhesive property is increased and thus the press life can be enhanced. Also, by the addition or undercoating of a hydrophilic polymer, for example, polyacrylic acid or polysulfonic acid, the developing property of the non-image area is improved and resistance to stain can be increased.

In the case of coating the photopolymerizable composition of the invention on a support, the composition is used after dissolving it in a variety of organic solvents. Examples of the solvent used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used individually or as a mixture of two or more theeof. The concentration of solid content in the coating solution is suitably from 2 to 50% by weight.

The coverage of the photosensitive layer on the support affects mainly the sensitivity and developing property of photosensitive layer, the strength of exposed layer and press life and therefore, an appropriate coverage is preferably selected according to the use. If the coverage is too small, press life is not sufficient, whereas if it is excessively large, the sensitivity decreases, as a result, not only the exposure but also the development processing disadvantageously take a longer time. In the case of a lithographic printing plate precursor for scanning exposure, which is a main object of the invention, the coverage is preferably from about 0.1 to about 10 $g/m^2$, more preferably from 0.5 to 5 $g/m^2$, in terms of the weight after drying.

<E. Support>

In order to obtain a lithographic printing plate as a main object of the invention, the above-described photosensitive layer is preferably provided on a support having a hydrophilic surface. As for the hydrophilic support, conventionally known hydrophilic supports used for lithographic printing plate precursors can be used without any limitation. The support used is preferably a dimensionally stable plate-like material, for example, paper, paper laminated with plastic (e.g., polyethylene, polypropylene or polystyrene), a metal plate (e.g., aluminum, zinc or copper), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film having laminated or vapor-deposited thereon the above-described metal. If desired, the surface of the support may be subjected to an appropriate known physical or chemical treatment for the purpose of for example, imparting hydrophilicity or improving the strength.

Among the supports, paper, a polyester film and an aluminum plate are preferred. In particular, the aluminum plate is preferred, because it has good dimensional stability, is relatively inexpensive and can provide a surface having excellent hydrophilicity and strength by a surface treatment, if desired. Also, the composite sheet comprising an aluminum sheet having bonded thereon a polyethylene terephthalate film described in JP-B48-18327 is preferred.

The aluminum plate is preferably a pure aluminum plate or an alloy plate mainly comprising aluminum and containing trace heteroelements. A plastic film laminated or vapor-deposited with aluminum may also be used. Examples of the hetero-element contained in the aluminum alloy include silicon, iron, manganese, copper, magnesium, chromium, zinc, bismuth, nickel and titanium. The content of hetero-element in the alloy is at most 10% by weight. The aluminum particularly preferred in the invention is pure aluminum, however, since perfectly pure aluminum is difficult to produce in view of the refining technique, the aluminum may contain trace hetero-elements. The composition of the aluminum plate for use in the invention is not particularly limited and aluminum plates having known compositions can be appropriately used. The thickness of the aluminum plate for use in the invention is approximately from 0.1 to 0.6 mm, preferably from 0.15 to 0.4 mm, more preferably from 0.2 to 0.3 mm.

In the case of a support having a metal surface, particularly an aluminum surface, the support is preferably subjected to a surface treatment, for example, surface roughening (graining) treatment, dipping treatment in an aqueous solution of, for example, sodium silicate, potassium fluorozirconate or phosphate, or anodizing treatment.

The surface roughening treatment of the aluminum plate can be performed by various methods, for example, a method of mechanically roughening the surface, a method of electrochemically dissolving and roughening the surface or a method of selectively dissolving the surface by chemical means. Examples of the mechanical method, which can be used, include known methods, for example, ball graining, brush graining, blast graining and buff graining. Examples of the electrochemical surface roughing method include a method of performing the surface roughening in an electrolytic solution, for example, hydrochloric acid or nitric acid by passing an alternating current or a direct current. A combination of these two kinds of methods disclosed in JP-A-54-63902 may also be used. If desired, in order to remove rolling oil on the surface, a degreasing treatment, for example, with a surfactant, an organic solvent or an alkaline aqueous solution is performed in advance of the surface roughening of the aluminum plate.

An aluminum plate, which is roughened and then treated by dipping in an aqueous sodium silicate solution, may also be preferably used. An aluminum plate subjected to an anodizing treatment and then to a dipping treatment in an aqueous alkali metal silicate solution described in JP-B-47-5125 is preferably used. The anodizing treatment is performed by passing a current using the aluminum plate as anode in an aqueous or non-aqueous electrolytic solution of an inorganic acid, for example, phosphoric acid, chromic acid, sulfuric acid or boric acid, an organic acid, for example, oxalic acid or sulfamic acid, or a salt thereof. The aqueous and non-aqueous electrolytic solutions may be used individually or in combination of two or more thereof.

The silicate electrodeposition method described in U.S. Pat. No. 3,658,662 is also effective.

Furthermore, a surface treatment in which a support subjected to electrolytic graining is combined with the above-described anodizing treatment and sodium silicate treatment, described in JP-B-46-27481, JP-A-52-58602 and JP-A-52-30503 is also useful.

Also, a support subjected to mechanical roughening, chemical etching, electrolytic graining, anodizing treatment and sodium silicate treatment in this order, described in JP-A-56-28893 is preferably used.

A support which is subjected to, after these treatments, undercoating, for example, with a water-soluble resin, e.g., polyvinylphosphonic acid, a polymer or copolymer having a sulfonic acid group in the side chain or polyacrylic acid, a water-soluble metal salt (e.g., zinc borate), a yellow dye, or an amine salt is also preferably used.

In addition, a substrate subjected to a sol-gel treatment, where a functional group capable of undergoing an addition reaction by a radical is covalently bonded, described in JP-A-7-159983 is also preferably used.

Other preferred examples include those obtained by providing a water-resistant hydrophilic layer as a surface layer on an appropriate support. Examples of the surface layer include a layer comprising an inorganic pigment and a binder described in U.S. Pat. No. 3,055,295 and JP-A-56-13168, a hydrophilic swelling layer described in JP-A-9-80744 and a sol-gel film comprising titanium oxide, polyvinyl alcohol and silicic acids described in JP-W-8-507727 (the term "JP-W" as used herein means an "unexamined published Japanese international patent application").

The hydrophilization treatment is performed not only to render the support surface hydrophilic but also to prevent a harmful reaction of the photopolymerizable composition provided thereon and at the same time, to improve adhesive property of the photosensitive layer.

<E. Protective Layer>

In the case of a lithographic printing plate precursor for scanning exposure as a preferred embodiment of the invention, the exposure is ordinarily performed in the air and therefore, a protective layer is preferably further provided on the photopolymerizable composition layer. The protective layer prevents low molecular weight compounds, for example, oxygen or basic substance present in the air, which inhibit the image forming reaction generated upon the exposure in the photosensitive layer, from permeating into the photosensitive layer and enables exposure in the air. Accordingly, the protective layer is demanded to have the following properties, that is, to have low permeability to oxygen or low molecular weight compounds, not to substantially inhibit the transmission of light used for the exposure, to exhibit good adhesion property to the photosensitive layer and to be easily removable in the development step after the exposure. Various investigations on the protective layer have been made and are described in detail, for example, in U.S. Pat. No. 3,458,311 and JP-A-55-49729. The material, which can be used for the protective layer, is preferably, for example, a water-soluble polymer compound having relatively excellent crystallinity. Specifically, a water-soluble polymer, for example, polyvinyl alcohol, polyvinyl pyrrolidone, acidic celluloses, gelatin, gum arabic or polyacrylic acid is known. Among these, when polyvinyl alcohol is used as the main component, most excellent results can be obtained in view of fundamental properties, for example, oxygen blocking property and removability by development.

The polyvinyl alcohol used for the protective layer may be partially substituted with an ester, an ether or an acetal insofar as it contains an unsubstituted vinyl alcohol unit necessary for providing the oxygen blocking property and water solubility. Also, it may partially have other copolymer component. Examples of the polyvinyl alcohol include those having a hydrolysis degree of 71 to 100% and a molecular weight of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA405, PVA-420, PVA-613 and L-8, produced by Kuraray Co., Ltd.

The components (selection of PVA, use of additives) and coating amount of the protective layer are determined by taking account of the oxygen blocking property, development removability, fogging property, adhesive property and scratch resistance. In general, as the hydrolysis degree of PVA is higher (as the unsubstituted vinyl alcohol unit content in the protective layer is higher) and as the layer thickness is larger, the oxygen blocking property becomes higher, which is advantageous in view of sensitivity. However, if the oxygen blocking property is excessively elevated, there arise problems, for example, an undesirable polymerization reaction takes place during the production or storage, or undesirable fog or thickening of image lines is caused at the time of image exposure. The adhesion property to the image area and scratch resistance are also important factors in view of handling of the plate. The coating method of the protective layer is described in detail, for example, in U.S. Pat. No. 3,458,311 and JP-A-55-49729.

Furthermore, other functions may also be imparted to the protective layer. For instance, when a coloring agent (e.g., water-soluble dye) having excellent transmittance of light at 350 to 450 nm used for the exposure and capable of efficiently absorbing light of 500 nm or longer is added, the safe light aptitude can be more improved without causing reduction in the sensitivity.

<G. Image Forming Method and Plate-Making Process>

In the case where a photosensitive material using the photosensitive composition of the invention is used as an image-forming material, an image is ordinarily obtained by performing image exposure and then removing the unexposed area of the photosensitive layer with a developer. Examples of the developer preferably employed for the manufacture of a lithographic printing plate using the photosensitive composition include a developer described in JP-B-57-7427. The developer is suitably an aqueous solution of an inorganic alkali agent, for example, sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, or an aqueous solution of an organic alkali agent, for example, monoethanolamine or diethanolamine. The concentration of the alkali agent in the alkali solution is from 0.1 to 10% by weight, preferably from 0.5 to 5% by weight.

If desired, the alkaline aqueous solution may contain a small amount of a surfactant or an organic solvent, for example, benzyl alcohol, 2-phenoxyethanol or 2-butoxyethanol. Examples thereof include those described in U.S. Pat. Nos. 3,375,171 and 3,615,480.

The developers described in JP-A-50-26601, JP-A-58-54341, JP-B-56-39464 and JP-B-56-42860 are also excellent.

As a particularly preferred developer, a developer that contains a nonionic compound represented by formula (IV) shown below and has a pH of from 11.5 to 12.8 and a conductivity of from 3 to 30 mS/cm described in JP-A-2002-202616 is illustrated.

$$A\text{-}W \qquad (IV)$$

wherein A represents a hydrophobic organic residue of A-H having log P of 1.5 or more, and W represents a hydrophilic organic residue of W—H having log P less than 1.0.

The developer composition is described in detail in paragraphs [0024] to [6067] of JP-A-2002-202616.

In the invention, it is effective that the nonionic compound represented by formula (IV) is added ordinarily from 0.1 to 15% by weight, preferably from 1.0 to 8.0% by weight, in the developer.

In another plate-making process of the lithographic printing plate precursor according to the invention, the entire surface may be heated, if desired, before or during exposure or between exposure and development. By the heating, the image forming reaction in the photosensitive layer is accelerated and effects, for example, improvement in the sensitivity and press life and stabilization of the sensitivity are achieved. For the purpose of improving the image strength and press life, it is also effective to perform entire after-heating or entire exposure of the image after development. Ordinarily, the heating before development is preferably performed under a mild condition of 150° C. or lower. When the temperature is 150° C. or lower, a problem of fogging in the non-image area does not occur. The heating after development uses a very strong condition, ordinarily from 200 to 500° C. A sufficiently high effect of strengthening the image is obtained at the temperature of 200° C. or higher, whereas problems, for example, deterioration of the support and thermal decomposition of the image area do not occur at the temperature of 500° C. or lower.

As for the exposure method of a lithographic printing plate precursor for scanning exposure according to the invention, known methods can be used without limitation. The desired light source has a wavelength of 350 to 450 nm and, specifically, an InGaN semiconductor laser is preferably used. The exposure mechanism may be any of internal drum system, external drum system and flat bed system. When the photosensitive composition of the invention used has high water solubility, the photosensitive layer can be made soluble in neutral water or alkalescent water and a lithographic printing plate precursor having such a construction can be loaded on a printing machine and then subjected to exposure and development on the machine.

As for the available laser light source of 350 to 450 nm, the followings can be used.

A gas laser, for example, an Ar ion laser (364 nm, 351 nm, 10 mW to 1 W), a Kr ion laser (356 nm, 351 nm, 10 mW to 1 W) and a He-Cd laser (441 nm, 325 nm, 1 to 100 mW) may be used.

A solid laser, for example, a combination of Nd:YAG ($YVO_4$) with SHG crystal×twice (355 nm, 5 mW to 1 W) and a combination of Cr:LiSAF with SHG crystal (430 nm, 10 mW) may be used.

A semiconductor laser system, for example, a $KNBOb_3$ ring resonator (430 nm, 30 mW), a combination of a waveguide-type wavelength conversion element with an AlGaAs or InGaAs semiconductor (380 to 450 nm, 5 to 100 mW), a combination of a waveguide-type wavelength conversion element with an AlGaInP or AlGaAs semiconductor (300 to 350 nm, 5 to 100 mW), and AlGaInN (350 to 450 nm, 5 to 30 mW) may be used.

A pulse laser, for example, a $N_2$ laser (337 nm, pulse: 0.1 to 10 mJ) and XeF (351 nm, pulse: 10 to 250 mJ) may be used.

Among the light sources, the AlGaInN semiconductor laser (commercially available InGaN semiconductor laser, 400 to 410 nm, 5 to 30 mW) is particularly preferable in view of the wavelength property and cost.

As for the exposure apparatus for a lithographic printing plate precursor of scanning exposure system, the exposure mechanism includes an internal drum system, an external drum system and a flat bed system. The above-described light sources except for the pulse laser are used as the light source. In practice, the following exposure apparatuses are particularly preferred in view of the relationship between the sensitivity of photosensitive material and the plate-making time.

A single beam exposure apparatus of internal drum system using one gas laser or solid laser light source.

A multi-beam exposure apparatus of flat bed system using multiple (10 or more) semiconductor lasers.

A multi-beam exposure apparatus of external drum system using multiple (10 or more) semiconductor lasers.

In the laser direct drawing-type lithographic printing plate precursor, the following equation (eq 1) is ordinarily established among the sensitivity X ($J/cm^2$) of photosensitive material, the exposure area S ($cm^2$) of photosensitive material, the power q (W) of one laser light source, the number n of lasers and the total exposure time t (s):

$$X \cdot S = n \cdot q \cdot t \qquad (\text{eq 1})$$

i) In the case of internal drum (single beam) system, the following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \quad \text{(eq 2)}$$

ii) In the case of external drum (multi-beam) system, the following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \quad \text{(eq 3)}$$

iii) In the case of flat bed (multi-beam) system, the following equation (eq 4) is ordinarily established among the revolution number H (radian/s) of polygon mirror, the sub-scanning length Lx (cm) of photosensitive material, the resolution Z (dot/cm), the total exposure time t (s) and the number (n) of beams:

$$H \cdot Z \cdot n \cdot t = Lx \quad \text{(eq 4)}$$

When the resolution (2,560 dpi) required for practical printing plate precursor, the plate size (A1/B1, sub-scanning length 42 inch), the exposure condition of about 20 sheets/1 hour and the photosensitive characteristics (photosensitive wavelength, sensitivity: about 0.1 mJ/cm$^2$) of the photosensitive composition of the invention are substituted for the above equations, it can be understood that a photosensitive material using the photosensitive composition of the invention is preferably combined with a multi-beam exposure system, and on taking account of operability, cost and the like, most preferably combined with an external drum system semiconductor laser multi-beam exposure apparatus.

Other exposure light beams, which can be used for the photosensitive composition of the invention, include an ultra-high pressure mercury lamp, a high pressure mercury lamp, a medium pressure mercury lamp, a low pressure mercury lamp, a chemical lamp, a carbon arc lamp, a xenon lamp, a metal halide lamp, various visible or ultraviolet laser lamps, a fluorescent lamp, a tungsten lamp and sunlight. As for the uses, the photosensitive composition of the invention can be applied not only to the lithographic printing plate precursor for scanning exposure but also to the uses over a wide range known as uses of photocurable resin without limitation. For instance, when applied to a liquid photopolymerizable composition using, if desired, a cation-polymerizable compound in combination, a high-sensitivity material for optical modeling can be obtained. A hologram material may also be prepared by making use of change in the refraction index accompanied with the photopolymerization. The photosensitive composition of the invention can also be applied to various transfer materials (e.g., peelable photosensitive material, toner development photosensitive material) by making use of change in the adhesion property on the surface accompanied with the photopolymerization; to photo-curing of microcapsules; to the production of electronic materials, for example, photoresists; and to photocurable resin materials, for example, ink, paint and adhesive.

The invention will be described in more detail with reference to the following examples, but the invention should not be consumed as being limited thereto.

SYNTHESIS EXAMPLE 1

Synthesis of Compound P-1

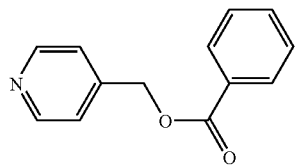

P-1

In 300 ml of acetonitrile was dissolved 25 g of 4-pyridinemethanol, the solution was cooled to 0° C. and 38.7 g of benzoyl chloride was dropwise added thereto. After the completion of the dropwise addition, the solution was stirred at 0° C. for 8 hours. After the completion of the reaction, the reaction solution was poured into 300 ml of water. To the mixed solution was added little by little sodium hydrogen carbonate until the solution showed alkalinity, followed by stirring for 30 minutes, and then ethyl acetate was added thereto to conduct extraction. The organic layer was dried over magnesium sulfate, the solvent was removed by distillation, and the residue was purified by column chromatography to obtain 6.7 g of Compound P-1 (yield: 61%, purity: 99.2%) as colorless liquid. The compound was identified with $^1$H-NMR (CDCl$_3$), infrared absorption spectrum, mass spectrum and elemental analysis.

SYNTHESIS EXAMPLE 2

Synthesis of Compound P-48

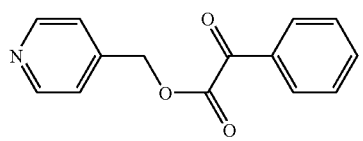

P-48

In 300 ml of dimethylacetamide were added 13.1 g of 4-chloromethylpyridine chloride, 18.3 g of benzoylformic acid, 24.9 g of potassium carbonate and 6.6 g of potassium iodide, and the mixture was heated to 90° C., followed by stirring for 2 hours. After the completion of the reaction, the reaction solution was poured into 300 ml of water, and then ethyl acetate was added thereto to conduct extraction. The organic layer was dried over magnesium sulfate, the solvent was removed by distillation, and the residue was purified by column chromatography to obtain 4.8 g of Compound P-48 (yield: 25%, purity: 99.5%) as colorless liquid. The compound was identified with $^1$H-NMR (CDCl$_3$), infrared absorption spectrum, mass spectrum and elemental analysis.

EXAMPLES 1 TO 15 AND COMPARATIVE EXAMPLES 1 TO 4

(Preparation of Support)

A 0.3 mm-thick aluminum plate was etched by dipping it in an aqueous 10% by weight sodium hydroxide solution at 60° C. for 25 seconds, washed with running water, neutralized and cleaned with an aqueous 20% by weight nitric acid solution and then washed with water. The aluminum plate was then subjected to an electrolytic surface roughening treatment in an aqueous 1% by weight nitric acid solution using an alternating current with a sinusoidal waveform at an anode time electricity of 300 coulomb/dm². Subsequently, the aluminum plate was dipped in an aqueous 1% by weight sodium hydroxide solution at 40° C. for 5 seconds, dipped in an aqueous 30% by weight sulfuric acid solution at 60° C. for 40 seconds to effect a desmut treatment, and then subjected to an anodizing treatment in an aqueous 20% by weight sulfuric acid solution for 2 minutes at a current density of 2 A/dm² to form an anodic oxide film having a thickness of 2.7 g/m². The surface roughness was measured and found to be 0.3 μm (Ra value according to JIS B0601).

On the back surface of the thus-treated plate, a sol-gel reaction solution shown below was coated by a bar coater and dried at 100° C. for 1 minute, thereby preparing a support having provided thereon a backcoat layer having a dry coating amount of 70 mg/m².

| Sol-gel reaction solution | |
|---|---|
| Tetraethyl silicate | 50 parts by weight |
| Water | 20 parts by weight |
| Methanol | 15 parts by weight |
| Phosphoric acid | 0.05 parts by weight |

The above components were mixed and stirred, and heat generation was started within about 5 minutes. After reacting the mixture for 60 minutes, the following solution was added to prepare the coating solution for backcoat layer.

| | |
|---|---|
| Pyrogallol formaldehyde condensation resin (molecular weight: 2,000) | 4 parts by weight |
| Dimethyl phthalate | 5 parts by weight |
| Fluorine-containing surfactant (N-butylperfluorooctane-sulfonamidoethyl acrylate/polyoxyethylene acrylate copolymer, molecular weight: 2 × 10⁴) | 0.7 parts by weight |
| Methanol silica sol (produced by Nissan Chemical Industries, Ltd., methanol: 30 wt %) | 50 parts by weight |
| Methanol | 800 parts by weight |

(Preparation of Photosensitive Layer)

On the thus-treated aluminum plate, a photopolymerizable composition having the following components was coated to have a dry coating amount of 1.4 g/m² and dried at 80° C. for 2 minutes to form a photosensitive layer.

| | |
|---|---|
| Pentaerythritol tetraacrylate | 1.5 g |
| Allyl methacrylate/methacrylic acid/N-isopropylacrylamide copolymer (copolymerization molar ratio: 70/14/16) | 1.9 g |
| Photo-initiation system (shown in Table 1 below) | |
| Pyridine compound | X g |
| Titanocene compound (T-1, T-2) | Y g |
| Co-sensitizer (H-1 – H-3) | Z g |
| Sensitizing dye A-1, A-11, A-20) | W g |
| Fluorine-containing nonionic surfactant (Megafac F-780F produced by Dainippon Ink & Chemicals, Inc.) | 0.02 g |

-continued

| | |
|---|---|
| Thermal polymerization inhibitor (N-nitrosophenylhydroxylamine aluminum salt) | 0.01 g |
| Pigment dispersion | 2.0 g |
| (Composition of pigment dispersion) | |
| Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |
| Methyl ethyl ketone | 20 g |
| Propylene glycol monomethyl ether | 20 g |

(Preparation of Protective Layer)

On the photosensitive layer, an aqueous solution containing 3% by weight of polyvinyl alcohol (saponification degree: 98 mol %, polymerization degree: 550) was coated to have a dry coating weight of 2 g/m² and dried at 100° C. for 2 minutes.

(Evaluation of Sensitivity)

A Fuji Step Guide (a gray scale discontinuously changing in the transmission optical density at ΔD=0.15) produced by Fuji Photo Film Co., Ltd. was brought into close contact with the thus-obtained photosensitive material and exposure was performed using a xenon lamp through an optical filter at a predetermined exposure energy. For the purpose of estimating the exposure aptitude for a short wavelength semiconductor laser, Kenko BP-40 was used as an optical filter to provide monochromic light of 400 nm. Thereafter, development was performed by dipping the photosensitive material in a developer having the composition shown below at 25° C. for 10 seconds, and the exposure energy amount was determined from the highest step number of the gray scale where the image was completely removed to evaluate the sensitivity (unit: mJ/cm²). As the energy amount is smaller, the sensitivity is higher. The results obtained are also shown in Table 1 below.

(Composition of Developer)

Aqueous solution of pH 12.0 having the following composition:

| | |
|---|---|
| Potassium hydroxide | 0.2 g |
| 1K Potassium silicate (SiO₂/K₂O = 1.9) | 2.4 g |
| Compound of formula (1) | 5.0 g |
| Ethylenediaminetetraacetate 4Na salt | 0.1 g |
| Water | 92.3 g |

(1)

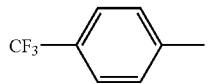

TABLE 1

| | Photo-Initiation System | | | | |
|---|---|---|---|---|---|
| | Pyridine Compound (X g) | Titanocene Compound (Y g) | Co-Sensitizer (Z g) | Sensitizing Dye (W g) | Clear Sensitivity (mJ/cm$^2$) |
| Example 1 | P-1 (0.10) | T-1 (0.10) | None | None | 0.80 |
| Example 2 | P-1 (0.20) | T-1 (0.15) | None | A-19 (0.15) | 0.30 |
| Example 3 | P-24 (0.20) | T-1 (0.15) | None | A-35 (0.12) | 0.30 |
| Example 4 | P-65 (0.10) | T-2 (0.12) | None | A-1 (0.12) | 0.35 |
| Example 5 | P-17 (0.15) | T-2 (0.10) | None | A-19 (0.15) | 0.35 |
| Example 6 | P-48 (0.10) | T-1 (0.15) | None | A-35 (0.15) | 0.28 |
| Example 7 | P-46 (0.20) | T-2 (0.10) | None | A-19 (0.15) | 0.35 |
| Example 8 | P-1 (0.08) | T-1 (0.15) | H-1 (0.15) | A-19 (0.15) | 0.20 |
| Example 9 | P-39 (0.15) | T-1 (0.10) | H-3 (0.20) | A-1 (0.12) | 0.20 |
| Example 10 | P-45 (0.20) | T-2 (0.12) | H-2 (0.15) | A-35 (0.15) | 0.10 |
| Example 11 | P-34 (0.15) | T-1 (0.10) | H-2 (0.10) | A-35 (0.15) | 0.10 |
| Example 12 | P-48 (0.12) | T-1 (0.10) | H-2 (0.20) | A-35 (0.12) | 0.08 |
| Example 13 | P-8 (0.15) | T-1 (0.12) | None | A-19 (0.15) | 0.30 |
| Example 14 | P-6 (0.15) | T-2 (0.10) | None | A-1 (0.12) | 0.35 |
| Example 15 | P-54 (0.20) | T-1 (0.12) | H-2 (0.20) | A-35 (0.12) | 0.08 |
| Comparative Example 1 | P-1 (0.10) | None | None | None | No image formed |
| Comparative Example 2 | None | T-1 (0.15) | None | None | 1.50 |
| Comparative Example 3 | None | T-1 (0.15) | None | A-19 (0.15) | 0.40 |
| Comparative Example 4 | PD-1 (0.10) | T-1 (0.20) | None | A-19 (0.15) | 0.40 |

As can be seen from the results shown in Table 1, Examples 1 to 15 using the photo-initiation system according to the invention exhibit high sensitivity sufficient for practical use, In comparison with Comparative Examples 2 and 3 not using the photo-initiation system according to the invention, it is apparent that the photo-initiation system according to the invention exhibits high sensitivity by using the titanocene compound together with the pyridine compound. It is also apparent that the use of the pyridine compound alone does not exhibit the initiation function as shown in Comparative Example 1 and that the sensitizing action does not obtained by adding a pyridine compound that does not have the specific structure according to the invention from the comparison of Example 2 with Comparative Example 4.

EXAMPLES 16 TO 20 AND COMPARATIVE EXAMPLE 5

Lithographic printing plates were produced in the procedure shown below and evaluated on the printing performance. The results are shown in Table 2 below.

<Pretreatment of Support>

The surface of a 0.3 mm-thick 1S aluminum plate was grained using No. 8 nylon brush and a water suspension of 800-mesh pumice stone and then thoroughly washed with water. Then, the aluminum plate was etched by dipping it in an aqueous 10% by weight sodium hydroxide solution at 70° C. for 60 seconds, washed with running water, neutralized and cleaned with an aqueous 20% by weight nitric acid solution and then washed with water. The plate was subjected to an electrolytic surface roughening treatment in an aqueous 1% by weight nitric acid solution using an alternating current with a sinusoidal waveform at an anode time electricity of 300 coulomb/dm$^2$ under the condition of $V_A$=12.7 V. The surface roughness was measured and found to be 0.45 μm (Ra value according to JIS B 0601).

<Hydrophilization Treatment of Support Surface>

The thus-treated support was dipped in an aqueous solution containing 2.5% by weight of No 3 sodium silicate (SiO$_2$=28 to 30%, Na$_2$O=9 to 10%, Fe=0.02% or less) at a pH of 11.2 and 70° C. for 13 seconds and then washed with water. From the amount of Si element measured by fluorescent X-ray analysis of the surface, the amount of silicate on the surface was determined as 10 mg/m$^2$.

<Coating of Interlayer>

A coating solution having the composition (A) shown below was prepared, coated on the hydrophilized surface of the support using a whirler under the condition of 180 rpm so as to have the amount of phenylphosphonic acid coated of 20 mg/m$^2$, and then dried at 80° C. for 30 seconds.

| (Interlayer Coating Solution A) | |
|---|---|
| Phenylphosphonic acid | 0.2 g |
| Methanol | 200 g |

<Coating of Photosensitive Layer>

A photosensitive solution having the composition shown below was prepared, coated on the support having provided thereon the interlayer using a whirler to have a coating amount of 1.4 g/m$^2$, and then dried at 100° C. for 1 minute.

| (Photosensitive solution) | |
|---|---|
| Addition-polymerizable compound (compound shown in Table 2) | 1.7 g |
| Binder polymer (compound shown in Table 2) | 2.0 g |
| Sensitizing dye (compound shown in Table 2) | 0.15 g |
| Titanocene compound (T-1) | 0.1 g |
| Co-sensitizer (compound shown in Table 2) | 0.2 g |

| -continued | |
|---|---|
| Pyridine compound (compound shown in Table 2) | 0.1 g |
| Coloring pigment dispersion | 2.0 g |
| (Composition of pigment dispersion) | |
| Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |
| Thermal polymerization inhibitor (N-nitrosophenylhydroxylamine aluminum salt) | 0.01 g |
| Surfactant (Megafac F-177, produced by Dainippon Ink & Chemicals, Inc.) | 0.02 g |
| Methyl ethyl ketone | 20.0 g |
| Propylene glycol monomethyl ether | 20.0 g |

<Coating of Protective Layer>

An aqueous 3% by weight solution of polyvinyl alcohol (saponification degree: 98 mol %, polymerization degree: 550) was coated on the photosensitive layer to have a dry coating weight of 2 g/m² and dried at 100° C. for 2 minutes.

<Exposure of Lithographic Printing Plate Precursor>

The thus-obtained lithographic printing plate precursor was subjected to solid image exposure or dot image exposure at 175 lines/inch increasing from 1 to 99% in 1% steps, using monochromatic light of 400 nm as a light source by adjusting the exposure power to give an exposure energy density of 200 µJ/cm² on the plate precursor surface.

<Development/Plate-Making>

A predetermined developer (shown in Table 2) and Finisher FP-2W both produced by Fuji Photo Film Co., Ltd. were charged into an automatic developing machine LP-850 produced by Fuji Photo Film Co., Ltd., and then the exposed printing plate precursor was subjected to development/plate-making at a developer temperature of 30° C. for a development time of 18 seconds to obtain a lithographic printing plate.

<Press Life Test of Image Area>

Printing was conducted using R201 produced by Roland Co. as a printing machine and GEOS-G (N) produced by Dainippon Ink & Chemicals, Inc. as ink. The solid image area of the printed material was observed and the press life was examined by a number of prints when the image started to become thin. As the numeral is larger, the press life is better.

<Press Life Test of Dot Image Under Forced Condition>

Printing was conducted using R201 produced by Roland Co. as a printing machine and GEOS-G (N) produced by Dainippon Ink & Chemicals, Inc. as ink. After printing of 5,000 sheets, the ink on the plate surface was cleaned by wiping the dot image area with a sponge for printing impregnated with PS Plate Cleaner CL-2 produced by Fuji Photo Film Co., Ltd. Thereafter, printing of 10,000 sheets was performed and the presence of cutting of dots on the printed material was visually observed.

<Stain Resistance Test of Non-Image Area>

Printing was conducted using R201 produced by Roland Co. as a printing machine and GEOS-G (S) produced by Dainippon Ink & Chemicals, Inc. as ink. The stain resistance was evaluated by observing the non-image area (unexposed area) of the printed material.

(Addition-Polymerizable Compounds Described in Table 2)

(M-1) Pentaerythritol tetraacrylate (NK Ester A-TMMT, produced by Shin-Nakamura Chemical Co., Ltd.)

(M-2) Glycerin dimethacrylate hexamethylene diisocyanate urethane prepolymer (UA101H, produced by Kyoeisha Chemical Co., Ltd.)

(Binder Polymers Described in Table 2)

(B-1) Allyl methacrylate/methacrylic acid/N-isopropylacrylamide (copolymerization molar ratio: 68/13/19)
   Acid value measured by NaOH titration: 1.14 meq/g
   Weight average molecular weight measured by GPC: $11\times10^4$ (B-2) Allyl methacrylate/methacrylic acid copolymer (copolymerization molar ratio 82/18)
   Acid value measured by NaOH titration: 1.58 meq/g
   Weight average molecular weight measured by GPC: $10.5\times10^4$ (B-3) Polyurethane resin of a condensation polymerization product of the following diisocyanates and diols
   4,4'-Diphenylmethane diisocyanate (MDI)
   Hexamethylene diisocyanate (HDMI)
   Polypropylene glycol (weight average molecular weight: 1,000) (PPG 1000)
   2,2-Bis(hydroxymethyl)propionic acid (DMPA)
   Tetraethylene glycol (TEG)
   Copolymerization molar ratio (MDI/HMDI/PPG 1000/DMPA/TEG): 39/11/12/26/12
   Acid value measured by KOH titration: 50.4 mg KOH/g
   Weight average molecular weight measured by GPC: $5.3\times10^4$ (Developer Described in Table 2)

| (DV-1) | |
|---|---|
| An aqueous solution of pH 10 having the following composition: | |
| Monoethanolamine | 0.1 part by weight |
| Triethanolamine | 1.5 parts by weight |
| Compound of formula (2) shown below | 4.0 parts by weight |
| Compound of formula (3) shown below | 2.5 parts by weight |
| Compound of formula (4) shown below | 0.2 part by weight |
| Water | 91.7 parts by weight |
| (DV-2) | |
| An aqueous solution of pH 10 having the following composition: | |
| Sodium hydrogencarbonate | 1.2 parts by weight |
| Sodium carbonate | 0.8 parts by weight |
| Compound of formula (2) shown below | 3.0 parts by weight |
| Compound of formula (3) shown below | 2.0 parts by weight |
| Compound of formula (4) shown below | 0.2 parts by weight |
| Water | 92.8 parts by weight |

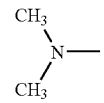

(2)

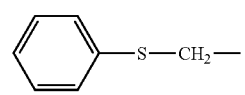

(3)

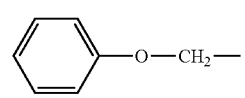

(4)

wherein R is H or $C_4H_9$ and n is about 4 (average value).

-continued (DV-4)
An aqueous solution of pH 12.0 having the following composition:

| | |
|---|---|
| Potassium hydroxide | 0.2 g |
| 1K Potassium silicate (SiO$_2$/K$_2$O = 1.9) | 2.4 g |
| Compound of formula (1) shown above | 5.0 g |
| Ethylenediaminetetraacetate 4Na salt | 0.1 g |
| Water | 92.3 g |

TABLE 2

| | Photosensitive Layer | | | | | | Printing Performance | | |
|---|---|---|---|---|---|---|---|---|---|
| No. | Addition-Polymerizable Compound | Binder Polymer | Sensitizing Dye | Pyridine Compound | Co-Sensitizer | Coating Amount (mg/m$^2$) | Developer Composition | Press Life of Image Area (sheets) | Press Life of Dot Image Area | Stain Resistance of Non-Image Area |
| Example 16 | M-1 | B-1 | A-17 | P-13 | None | 1.4 | DV-4 | 60,000 | Good | Good |
| Example 17 | M-1 | B-2 | A-25 | P-27 | None | 1.4 | DV-4 | 53,000 | Good | Good |
| Example 18 | M-2 | B-3 | A-31 | P-56 | H-2 | 1.4 | DV-4 | 90,000 | Good | Good |
| Example 19 | M-1 | B-1 | A-5 | P-2 | H-2 | 1.5 | DV-2 | 65,000 | Good | Good |
| Example 20 | M-2 | B-3 | A-18 | P-40 | H-3 | 1.4 | DV-1 | 75,000 | Good | Good |
| Comparative Example 5 | M-1 | B-1 | A-17 | None | None | 1.4 | DV-4 | 35,000 | Good | Good |

As is apparent from Table 2, the lithographic printing plate precursor having a photosensitive layer comprising the photosensitive composition according to the invention can provide an excellent lithographic printing plate even under the condition such that plate-making can be performed with high productivity by scanning exposure, namely, under the very low energy exposure condition. On the other hand, in Comparative Example 5 wherein the initiation system according to the invention is not used, a practically usable lithographic printing plate cannot be obtained.

The structures of the compounds other than the pyridine compounds and sensitizing dyes used in Examples and Comparative Examples are shown below.

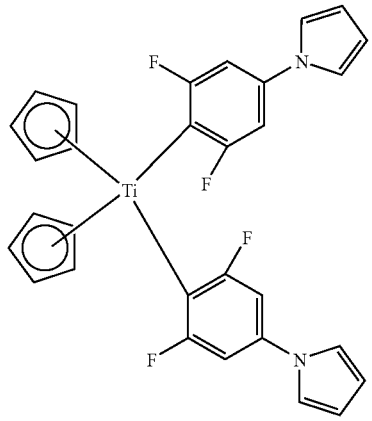

T-1

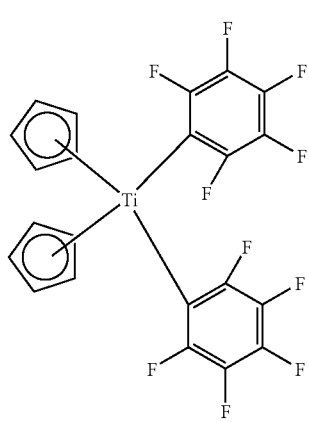

T-2

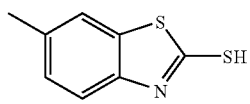

H-1

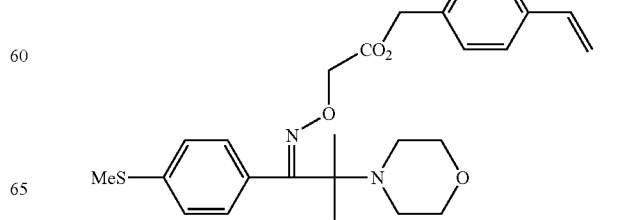

H-2

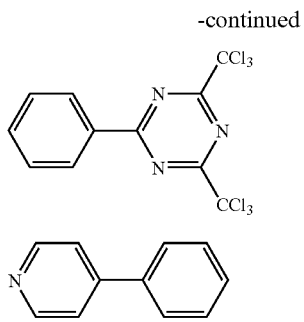

H-3

SYNTHESIS EXAMPLE 3

Synthesis of Compound C-1

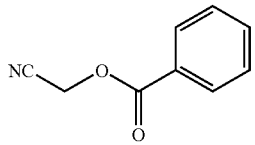

C-1

In 10.0 g of glycolnitrile (as a 55% by weight aqueous solution) was cooled to 0° C., and 20.3 g of benzoyl chloride and then 14.6 g of triethylamine were dropwise added thereto. After the completion of the dropwise addition, the solution was stirred at 0° C. for 8 hours. After the completion of the reaction, the reaction solution was allowed to stand to reach room temperature and then ethyl acetate was added thereto to conduct extraction. The organic layer was dried with magnesium sulfate, the solvent was removed by distillation, and the residue was purified by column chromatography to obtain 10.1 g of Compound C-1 (yield: 65%, purity: 99.0%) as colorless liquid. The compound was identified with $^1$H-NMR (CDCl$_3$), infrared absorption spectrum, mass spectrum and elemental analysis.

EXAMPLES 21 TO 35 AND COMPARATIVE EXAMPLE 6 TO 9

(Preparation of Support)

The support was prepared in the same manner as in Examples 1 to 15.

(Preparation of Photosensitive Layer)

On the aluminum plate, a photosensitive composition having the following components was coated to have a dry coating amount of 1.4 g/m$^2$ and dried at 80° C. for 2 minutes to form a photosensitive layer.

| | |
|---|---|
| Pentaerythritol tetraacrylate | 1.6 g |
| Allyl methacrylate/methacrylic acid/N-isopropylacrylamide copolymer (copolymerization molar ratio: 70/14/16) | 2.0 g |
| Photo-initiation system (shown in Table 3 below) | |
| Cyan compound | X g |
| Titanocene compound (T-1, T-2) | Y g |
| Co-sensitizer (H-1', H-2, H-3') | Z g |
| Sensitizing dye A-1', A-10', A-20') | W g |
| Megafac Fluorine-containing nonionic surfactant (F-780F produced by Dainippon Ink & Chemicals, Inc.) | 0.02 g |
| Thermal polymerization inhibitor (N-nitrosophenylhydroxylamine aluminum salt) | 0.01 g |
| Pigment dispersion | 2.0 g |

(Composition of Pigment Dispersion)

| | |
|---|---|
| Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |
| Methyl ethyl ketone | 20 g |
| Propylene glycol monomethyl ether | 20 g |

(Preparation of Protective Layer)

On the photosensitive layer, an aqueous solution containing 3% by weight of polyvinyl alcohol (saponification degree: 98 mol %, polymerization degree: 550) was coated to have a dry coating weight of 2 g/m$^2$ and dried at 100° C. for 2 minutes.

(Evaluation of Sensitivity)

With the thus-obtained photosensitive materials, the sensitivity was evaluated in the same manner as in Examples 1 to 15. The results obtained are also shown in Table 3 below.

TABLE 3

| | Photo-Initiation System | | | | Clear Sensitivity (mJ/cm$^2$) |
|---|---|---|---|---|---|
| | Cyan Compound (X g) | Titanocene Compound (Y g) | Co-Sensitizer (Z g) | Sensitizing Dye (W g) | |
| Example 21 | C-1 (0.10) | T-1 (0.10) | None | None | 0.75 |
| Example 22 | C-1 (0.20) | T-1 (0.10) | None | A-21 (0.15) | 0.35 |
| Example 23 | C-34 (0.20) | T-1 (0.20) | None | A-40 (0.15) | 0.30 |
| Example 24 | C-32 (0.15) | T-2 (0.15) | None | A-6 (0.10) | 0.40 |
| Example 25 | C-36 (0.15) | T-2 (0.10) | None | A-21 (0.15) | 0.35 |
| Example 26 | C-17 (0.15) | T-1 (0.15) | None | A-40 (0.12) | 0.30 |
| Example 27 | C-45 (0.20) | T-2 (0.10) | None | A-21 (0.15) | 0.35 |
| Example 28 | C-1 (0.10) | T-1 (0.12) | H-1' (0.15) | A-21 (0.12) | 0.25 |
| Example 29 | C-13 (0.15) | T-1 (0.10) | H-3' (0.20) | A-6 (0.12) | 0.25 |

TABLE 3-continued

| | Photo-Initiation System | | | | |
|---|---|---|---|---|---|
| | Cyan Compound (X g) | Titanocene Compound (Y g) | Co-Sensitizer (Z g) | Sensitizing Dye (W g) | Clear Sensitivity (mJ/cm$^2$) |
| Example 30 | C-20 (0.10) | T-2 (0.10) | H-2 (0.15) | A-40 (0.15) | 0.12 |
| Example 31 | C-43 (0.15) | T-1 (0.10) | H-2 (0.10) | A-40 (0.15) | 0.12 |
| Example 32 | C-34 (0.12) | T-1 (0.15) | H-2 (0.20) | A-40 (0.15) | 0.10 |
| Example 33 | C-7 (0.15) | T-1 (0.12) | None | A-21 (0.15) | 0.45 |
| Example 34 | C-35 (0.20) | T-2 (0.10) | None | A-6 (0.15) | 0.35 |
| Example 35 | C-44 (0.20) | T-1 (0.15) | H-2 (0.20) | A-40 (0.12) | 0.10 |
| Comparative Example 6 | C-17 (0.10) | None | None | None | No image formed |
| Comparative Example 7 | None | T-1 (0.10) | None | None | 1.60 |
| Comparative Example 8 | None | T-1 (0.10) | None | A-21 (0.15) | 0.45 |
| Comparative Example 9 | CD-1 (0.10) | T-1 (0.10) | None | A-21 (0.15) | 0.45 |

As can be seen from the results shown in Table 3, Examples 21 to 35 using the photo-initiation system according to the invention exhibit high sensitivity sufficient for practical use. In comparison with Comparative Examples 7 and 8 not using the photo-initiation system according to the invention, it is apparent that the photo-initiation system according to the invention exhibits high sensitivity by using the titanocene compound together with the cyan compound. It is also apparent that the use of the cyan compound alone does not exhibit the initiation function as shown in Comparative Example 6 and that the sensitizing action does not obtained by adding a cyan compound that does not have the specific structure according to the invention from the comparison of Example 22 with Comparative Example 9.

EXAMPLES 36 TO 40 AND COMPARATIVE EXAMPLE 10

Lithographic printing plates were produced in the procedure shown below and evaluated on the printing performance. The results are shown in Table 4 below.

<Pretreatment of Support>

The pretreatment of support, hydrophilization treatment of support surface and coating of interlayer were conducted in the same manner as in Examples 16 to 20.

<Coating of Photosensitive Layer>

A photosensitive solution having the composition shown below was prepared, coated on the support having provided thereon the interlayer using a whirler to have a coating amount of 1.4 g/m$^2$, and then dried at 100° C. for 1 minute.

(Photosensitive solution)

| | |
|---|---|
| Addition-polymerizable compound (compound shown in Table 4) | 1.5 g |
| Binder polymer (compound shown in Table 4) | 1.9 g |
| Sensitizing dye (compound shown in Table 4) | 0.20 g |
| Titanocene compound (T-1) | 0.15 g |
| Co-sensitizer (compound shown in Table 4) | 0.2 g |
| Cyan compound (compound shown in Table 4) | 0.20 g |
| Coloring pigment dispersion | 2.0 g |
| (Composition of pigment dispersion) | |
| Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |
| Thermal polymerization inhibitor (N-nitrosophenylhydroxylamine aluminum salt) | 0.01 g |
| Surfactant (Megafac F-177, produced by Dainippon Ink & Chemicals, Inc.) | 0.02 g |
| Methyl ethyl ketone | 20.0 g |
| Propylene glycol monomethyl ether | 20.0 g |

Subsequently, the coating of protective layer, exposure of lithographic printing plate precursor, development/plate-making, press life test of image area, press life test of dot image under forced condition and stain resistance test of non-image area were conducted in the same manner as in Examples 16 to 20.

(Addition-Polymerizable Compounds Described in Table 4)

(M-1) Pentaerythritol tetraacrylate (NK Ester A-TMMT, produced by Shin-Nakamura Chemical Co., Ltd.)

(M-2) Glycerin dimethacrylate hexamethylene diisocyanate urethane prepolymer (UA101H, produced by Kyoeisha Chemical Co., Ltd.)

(Binder Polymers Described in Table 4)

(B-1) Allyl methacrylate/methacrylic acid/N-isopropylacrylamide (copolymerization molar ratio: 67/14/19)
Acid value measured by NaOH titration: 1.20 meq/g
Weight average molecular weight measured by GPC: 12.3×10$^4$ (B-2) Allyl methacrylate/methacrylic acid copolymer (copolymerization molar ratio 82/18)
Acid value measured by NaOH titration: 1.58 meq/g
Weight average molecular weight measured by GPC: 10.5×10$^4$ (B-3) Polyurethane resin of a condensation polymerization product of the following diisocyanates and diols
4,4'-Diphenylmethane diisocyanate (MDI)
Hexamethylene diisocyanate (HMDI)
Polypropylene glycol (weight average molecular weight: 1,000) (PPG 1000)
2,2-Bis(hydroxymethyl)propionic acid (DMPA)
Tetraethylene glycol (TEG)

Copolymerization molar ratio (MDI/HMDI/PPG 1000/ DMPA/TEG): 39/11/10/26/14

Acid value measured by KOH titration: 51.8 mg KOH/g

Weight average molecular weight measured by GPC: $5.1 \times 10^4$

Developers (DV-1), (DV-2) and (DV-4) described in Table 4 are same as those described in Examples 16 to 20.

TABLE 4

|  | Photosensitive Layer | | | | | | | Printing Performance | | |
|---|---|---|---|---|---|---|---|---|---|---|
| No. | Addition-Polymerizable Compound | Binder Polymer | Sensitizing Dye | Cyan Compound | Co-Sensitizer | Coating Amount (mg/m²) | Developer Composition | Press Life of Image Area (sheets) | Press Life of Dot Image Area | Stain Resistance of Non-Image Area |
| Example 36 | M-1 | B-1 | A-29 | C-21 | None | 1.4 | DV-4 | 55,000 | Good | Good |
| Example 37 | M-1 | B-2 | A-20 | C-38 | None | 1.4 | DV-4 | 50,000 | Good | Good |
| Example 38 | M-2 | B-3 | A-22 | C-40 | H-2 | 1.4 | DV-4 | 95,000 | Good | Good |
| Example 39 | M-1 | B-1 | A-39 | C-47 | H-2 | 1.5 | DV-2 | 70,000 | Good | Good |
| Example 40 | M-2 | B-3 | A-38 | C-4 | H-3' | 1.4 | DV-1 | 75,000 | Good | Good |
| Comparative Example 10 | M-1 | B-1 | A-29 | None | None | 1.4 | DV-4 | 30,000 | Good | Good |

As is apparent from Table 4, the lithographic printing plate precursor having a photosensitive layer comprising the photosensitive composition according to the invention can provide an excellent lithographic printing plate even under the condition such that plate-making can be performed with high productivity by scanning exposure, namely, under the very low energy exposure condition. On the other hand, in Comparative Example 10 wherein the initiation system according to the invention is not used, a practically usable lithographic printing plate cannot be obtained.

The structures of the compounds other than the cyan compounds and sensitizing dyes used in Examples and Comparative Examples are shown below.

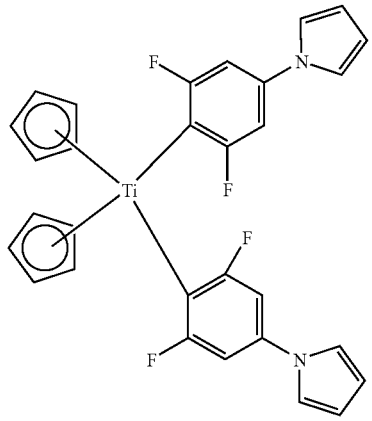

T-1

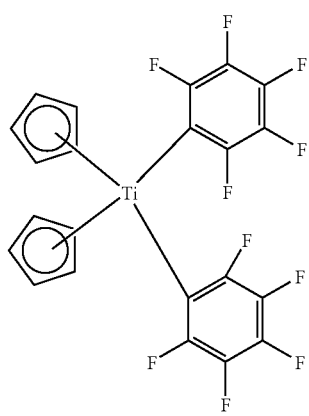

-continued

T-2

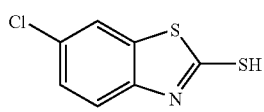

H-1'

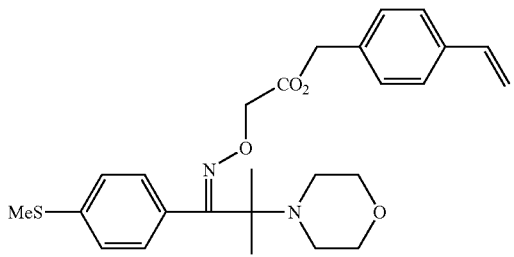

H-2'

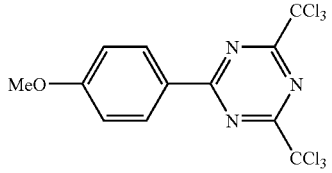

H-3'

-continued

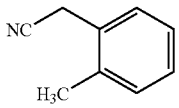

CD-1

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A photosensitive composition comprising (i) a titanocene compound, (ii) a compound selected from a pyridine compound represented by formula (1) shown below and a cyan compound represented by formula (3) shown below, and (iii) a compound capable of undergoing a reaction with at least one of a radical and an acid to irreversibly change its physical or chemical property:

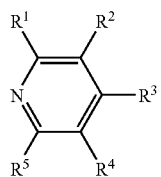

(1)

wherein $R^1$, $R^2$, $R^3$, $R^4$ and $R^5$ each independently represents a hydrogen atom, a halogen atom or an organic group, or at least one of $R^1$ and $R^2$, $R^2$ and $R^3$, $R^3$ and $R^4$, and $R^4$ and $R^5$ may be combined with each other to form a ring, provided that at least one of $R^1$, $R^2$, $R^3$, $R^4$ and $R^5$ represents an organic group represented by formula (2) shown below, and wherein when $R^1$ or $R^5$ represents an organic group represented by formula (2), $R^3$ represents a hydrogen atom, a halogen atom, an alkyl group, a substituted alkyl group, an aryl group, an alkenyl group, a substituted alkenyl group, an alkynyl group, a substituted alkynyl group, a hydroxy group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group;

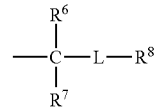

(2)

wherein $R^6$, $R^7$ and $R^8$ each independently represents a hydrogen atom, a halogen atom or an organic group, or $R^7$ and $R^8$, $R^6$ and $R^7$, or $R^6$ and $R^8$ may be combined with each other to form a ring; and L represents a divalent connecting group containing a hetero atom;

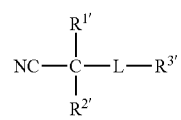

(3)

wherein $R^{1'}$, $R^{2'}$ and $R^{3'}$ each independently represents a hydrogen atom, a halogen atom or an organic group, or $R^{1'}$ and $R^{2'}$, $R^{2'}$ and $R^{3'}$, or $R^{1'}$ and $R^{3'}$ may be combined with each other to form a ring; and L represents a divalent connecting group containing a hetero atom.

2. The photosensitive composition as claimed in claim 1, wherein the compound of (ii) is the pyridine compound represented by formula (1).

3. The photosensitive composition as claimed in claim 1, wherein the compound of (ii) is the cyan compound represented by formula (3).

4. The photosensitive composition as claimed in claim 1, wherein the compound capable of undergoing a reaction with at least one of a radical and an acid to irreversibly change its physical or chemical property is a compound having an ethylenically unsaturated double bond.

5. A lithographic printing plate precursor comprising a photosensitive layer including the photosensitive composition according to claim 1.

6. A lithographic printing plate precursor comprising:
an aluminum support having a surface subjected to a surface roughening treatment; and
a photosensitive layer on the surface of the aluminum support, the photosensitive layer comprising the photosensitive composition of claim 1.

* * * * *